(12) United States Patent
McCreery et al.

(10) Patent No.: US 7,737,433 B2
(45) Date of Patent: Jun. 15, 2010

(54) ELECTRONIC JUNCTION DEVICES FEATURING REDOX ELECTRODES

(75) Inventors: Richard L. McCreery, Worthington, OH (US); Kenneth J. Mobley, Colorado Springs, CO (US); Jing Wu, Edmonton, CA (US)

(73) Assignees: The Ohio State University Research Foundation, Columbus, OH (US); Zettacore, Inc., Englewood, CO (US)

( * ) Notice: Subject to any disclaimer, the term of this patent is extended or adjusted under 35 U.S.C. 154(b) by 0 days.

(21) Appl. No.: 11/536,031

(22) Filed: Sep. 28, 2006

(65) Prior Publication Data
US 2007/0090348 A1    Apr. 26, 2007

Related U.S. Application Data

(63) Continuation-in-part of application No. 10/795,904, filed on Mar. 8, 2004, now Pat. No. 7,141,299.

(51) Int. Cl.
*H01L 35/24* (2006.01)
*H01L 51/00* (2006.01)

(52) U.S. Cl. ............. 257/40; 257/E51.001; 428/333; 428/411.1; 428/457

(58) Field of Classification Search ........... 257/40; 428/333, 411.1, 457, 702
See application file for complete search history.

(56) References Cited

U.S. PATENT DOCUMENTS 4,584,235 A    4/1986    Roberts et al.

(Continued)

FOREIGN PATENT DOCUMENTS

JP    09-219395 A    8/1997

(Continued)

OTHER PUBLICATIONS

Adenier, A. et al., Covalent Modification of Iron Surfaces by Electrochemical Reduction of Aryldiazonium Salts, J. Am. Chem. Soc., 123(19), 2001, pp. 4541-4549.

(Continued)

*Primary Examiner*—Kenneth A Parker
*Assistant Examiner*—Anthony Ho
(74) *Attorney, Agent, or Firm*—Standley Law Group LLP

(57) ABSTRACT

The electronic properties of molecular junctions of the general type carbon/molecule/$TiO_2$/Au as examples of "molecular heterojunctions" consisting of a molecular monolayer and a semiconducting oxide. Junctions containing fluorene bonded to pyrolyzed photoresist film (PPF) were compared to those containing $Al_2O_3$ instead of fluorene, and those with only the $TiO_2$ layer. The responses to voltage sweep and pulse stimulation were strongly dependent on junction composition and temperature. A transient current response lasting a few milliseconds results from injection and trapping of electrons in the $TiO_2$ layer, and occurred in all three junction types studied. Conduction in PPF/$TiO_2$/Au junctions is consistent with space charge limited conduction at low voltage, then a sharp increase in current once the space charge fills all the traps. With fluorene present, there is a slower, persistent change in junction conductance which may be removed by a reverse polarity pulse. This "memory" effect is attributed to a redox process in the $TiO_2$ which generates $Ti^{III}$ and/or $Ti^{II}$, which have much higher conductance than $TiO_2$ due to the presence of conduction band electrons. The redox process amounts to "dynamic doping" of the $TiO_2$ layer by imposed electric field. The memory effect arises from a combination of the properties of the molecular and oxide layers, and is a special property of the molecular heterojunction configuration.

50 Claims, 22 Drawing Sheets

U.S. PATENT DOCUMENTS

| | | | |
|---|---|---|---|
| 4,599,705 A | 7/1986 | Holmberg et al. | |
| 4,828,917 A | 5/1989 | Wegner et al. | |
| 5,208,154 A | 5/1993 | Weaver et al. | |
| 5,327,373 A | 7/1994 | Liu et al. | |
| 5,424,974 A | 6/1995 | Liu et al. | |
| 5,520,968 A | 5/1996 | Wynne et al. | |
| 5,521,423 A | 5/1996 | Shinriki et al. | |
| 5,804,049 A | 9/1998 | Chan | |
| 5,834,100 A * | 11/1998 | Marks et al. | 428/209 |
| 5,846,909 A | 12/1998 | McDevitt et al. | |
| 5,908,692 A | 6/1999 | Hamers et al. | |
| 5,997,958 A | 12/1999 | Sato et al. | |
| 6,031,756 A | 2/2000 | Gimzewski et al. | |
| 6,046,925 A | 4/2000 | Tsien et al. | |
| 6,090,933 A | 7/2000 | Kayyem et al. | |
| 6,091,186 A | 7/2000 | Cao et al. | |
| 6,103,868 A | 8/2000 | Heath et al. | |
| 6,111,302 A | 8/2000 | Zhang et al. | |
| 6,114,099 A | 9/2000 | Liu et al. | |
| 6,124,963 A | 9/2000 | Schumaker | |
| 6,128,214 A | 10/2000 | Kuekes et al. | |
| 6,165,383 A * | 12/2000 | Chou | 252/301.16 |
| 6,198,655 B1 | 3/2001 | Heath et al. | |
| 6,208,553 B1 | 3/2001 | Gryko et al. | |
| 6,314,019 B1 | 11/2001 | Kuekes et al. | |
| 6,316,098 B1 * | 11/2001 | Yitzchaik et al. | 428/339 |
| 6,324,091 B1 | 11/2001 | Gryko et al. | |
| 6,381,169 B1 | 4/2002 | Bocian et al. | |
| 6,459,095 B1 | 10/2002 | Heath et al. | |
| 6,558,219 B1 * | 5/2003 | Burroughes et al. | 445/24 |
| 6,657,884 B2 | 12/2003 | Bocian et al. | |
| 6,661,691 B2 | 12/2003 | Fricke et al. | |
| 6,674,121 B2 | 1/2004 | Misra et al. | |
| 6,855,417 B2 | 2/2005 | McCreery | |
| 6,855,950 B2 | 2/2005 | McCreery | |
| 6,919,128 B2 | 7/2005 | McCreery | |
| 7,019,449 B2 | 3/2006 | McCreery | |
| 7,042,006 B2 | 5/2006 | McCreery | |
| 7,112,366 B2 | 9/2006 | McCreery | |
| 7,141,299 B2 | 11/2006 | McCreery | |
| 7,307,870 B2 | 12/2007 | Kuhr et al. | |

FOREIGN PATENT DOCUMENTS

| | | | |
|---|---|---|---|
| JP | 09-307157 A | 11/1997 | |
| WO | 92/13983 A1 | 8/1992 | |
| WO | WO 9948337 A1 * | 9/1999 | |

OTHER PUBLICATIONS

Akpati, H.C. et al., The effects of an external electric field on the adatom-surface bond: H and Al adsorbed on Si(111), Surface Science, 372, 1997, pp. 9-20.

Allongue, P. et al., Covalent Modification of Carbon Surfaces by Aryl Radicals Generated from the Electrochemical Reduction of Diazonium Salts, J. Am. Chem. Soc., 119(1), 1997, pp. 201-207.

Andrieux, C.P. et al., Derivatization of Carbon Surfaces by Anodic Oxidation of Arylacetates. Electrochemical Manipulation of the Grafted Films, J. Am. Chem. Soc., 119(18), 1997, pp. 4292-4300.

Aviram, A. et al., Molecular Rectifiers, Chemical Physics Letters, 29(2), Nov. 15, 1974, pp. 277-283.

Bredas, J.L., Relationship between band gap and bond length alternation in organic conjugates polymers, J. Chem. Phys. 82(8), Apr. 15, 1985, pp. 3808-3811.

Bredas, J.L. et al., Electronic structure of $\pi$-conjugated oligomers and polymers: a quantum-chemical approach to transport properties, Synthetic Metals, 125, 2002, pp. 107-116.

Bumm, L.A. et al., Are Single Molecular Wires Conducting?, Science, 271, Mar. 22, 1996, pp. 1705-1707.

Bumm, L.A. et al., Electron Transfer through Organic Molecules, J. Phys. Chem. B, 103(38), 1999, pp. 8122-8127.

Champagne, B. et al., Bond Length Alternation Effects on the Static Electronic Polarizability and Second Hyperpolarizability of Polyacetylene Chains, International Journal of Quantum Chemistry, 75(4/5), 1999, pp. 441-447.

Chen, J. et al., Large On-Off Ratios and Negative Differential Resistance in a Molecular Electronic Device, Science, 286, Nov. 19, 1999, pp. 1550-1552.

Chen, J. et al., Room-temperature negative differential resistance in nanoscale molecular junctions, Applied Physics Letters, 77(8), Aug. 21, 2000, 1224-1226.

Chen, P. et al., Control of Electron Transfer Kinetics at Glassy Carbon Electrodes by Specific Surface Modification, Analytical Chemistry, 68(22), Nov. 15, 1996, pp. 3958-3965.

Collier, C.P. et al., Electronically Configurable Molecular-Based Logic Gates, Science, 285, Jul. 16, 1999, pp. 391-394.

Collier, C.P. et al., A [2]Catenane-Based Solid State Electronically Reconfigurable Switch, Science, 289, Aug. 18, 2000, pp. 1172-1175.

Cygan, M.T. et al., Insertion, Conductivity, and Structures of Conjugated Organic Oligomers in Self-Assembled Alkanethiol Monolayers on AU(111), J. Am. Chem. Soc., 120(12), 1998, pp. 2721-2732.

Datta, S. et. al., Current-Voltage Characteristics of Self-Assembled Monolayers by Scanning Tunneling Microscopy, Physical Review Letters, 79(13), Sep. 29, 1997, pp. 2530-2533.

Delamar, M. et al., Covalent Modification of Carbon Surfaces by Grafting of Functionalized Aryl Radicals Products from Electrochemical Reduction of Diazonium Salts, J. Am. Chem. Soc., 114, 1992, pp. 5883-5884.

De Villeneuve, C.H. et al., Electrochemical Formation of Close-Packed Phenyl Layers on Si(111), J. Phys. Chem. B., 101(14), 1997, pp. 2415-2420.

Donhauser, Z.J. et al., Conductance Switching in Single Molecules Through Conformational Changes, Science, 292, Jun. 22, 2001, pp. 2303-2307.

Gittins, D.I. et al., Diode-like electron transfer across nanostructured films containing a redox ligand, J. Mater. Chem., 10, 2000, pp. 79-83.

Gracias, D.H. et al., Forming Electrical Networks in Three Dimensions by Self-Assembly, Science, 289, Aug. 18, 2000, pp. 1170-1172.

Gryko, D. et al., Studies related to the design and synthesis of a molecular octal counter, J. Mater. Chem., 11, 2001, pp. 1162-1180.

Hamers, R.J. et al., Cycloaddition Chemistry of Organic Molecules with Semiconductor Surfaces, Acc. Chem. Res., 33(9), 2000, pp. 617-624.

Hovis, J.S. et al., Cycloaddition Chemistry at Surfaces: Reaction of Alkenes with the Diamond(001)-2 x 1 Surface, J. Am. Chem. Soc., 122(4), 2000, pp. 732-733.

Joachim, C. et al., Electronic Transparence of a Single C60 Molecule, Physical Review Letters, 74(11), Mar. 13, 1995, pp. 2102-2105.

Jortner, J. et al., Molecular Electronics, International Union of Pure and Applied Chemistry, Blackwell Science, 1997, 70 pages.

Karzazi, Y. et al., Negative Differential Resistance Behavior in Conjugated Molecular Wires Incorporating Spacers: A Quantum-Chemical Description, J. Am. Chem. So., 123(41), 2001, pp. 10076-10084.

Kergueris, C. et al., Electron transport through a metal-molecule-metal junction, Physical Review B., 59(19), May 15, 1999, pp. 12505-12513.

Kuo, T-C., Raman Spectroscopy and Electrochemistry of Modified Carbon Surfaces, Dissertation, The Ohio State University, 1999, 6 pages.

Liu, Y-C. et al., Reactions of Organic Monolayers on Carbon Surfaces Observed with Unenhanced Raman Spectroscopy, J. Am. Chem. Soc., 117(45), 1995, pp. 11254-11259.

Liu, Y-C. et al., Raman Spectroscopic Determination of the Structure and Orientation of Organic Monolayers Chemisorbed on Carbon Electrode Surfaces, Analytical Chemistry, 69(11), Jun. 1, 1997, pp. 2091-2097.

McCarty, G.S. et al., Scanning Probe Studies of Single Nanostructures, Chem. Rev., 99(7), 1999, pp. 1983-1990.

Mirkin, C.A. et al., Molecular Electronics, Annu. Rev. Phys. Chem., 43, 1992, pp. 719-754.

Musick, M. D. et al., Metal Films Prepared by Stepwise Assembly. 2. Construction and Characterization of Colloidal Au and Ag Multilayers, Chem. Mater., 12(10), 2000, pp. 2869-2881.

Padowitz, D.F. et al., Voltage-Dependent STM Images of Covalently Bound Molecules on Si(100), J. Phys. Chem. B., 102(43), 1998, pp. 8541-8545.

Ranganathan, S. et al., Photoresist-Derived Carbon for Microelectromechanical Systems and Electrochemical Applications, Journal of The Electrochemical Society, 147(1), 2000, pp. 277-282.

Ranganathan, S. et al., Covalently Bonded Organic Monolayers on a Carbon Substrate: A New Paradigm for Molecular Electronics, Nano Letters, 1(9), 2001, pp. 491-494.

Ranganathan, S. et al., Electroanalytical Performance of Carbon Films with Near-Atomic Flatness, Analytical Chemistry, 73(5), Mar. 1, 2001, pp. 893-900.

Reed, M.A. et al., Conductance of a Molecular Junction, Science, 278, Oct. 10, 1997, pp. 252-254.

Reed, M.A. et al., Computing with Molecules, Scientific American, Jun. 2000, pp. 86-93.

Reed, M.A. et al., Molecular random access memory cell, Applied Physics Letters, 78(23), Jun. 4, 2001, pp. 3735-3737.

Rueckes, T. et al., Carbon Nanotube-Based Nonvolatile Random Access Memory for Molecular Computing, Science, 289, Jul. 7, 2000, pp. 94-97.

Schwartz, M.P. et al., Interaction of π-Conjugated Organic Molecules with π-Bonded Semiconductor Surfaces: Structure, Selectivity, and Mechanistic Implication, J. Am. Chem. Soc., 122(35), 2000, pp. 8529-8538.

Solak, A.O. et al., A Mechanism for Conductance Switching in Carbon-Based Molecular Electronic Junctions, Electrochemical and Solid-State Letters, 5, 2002, E43-E46.

Storhoff, J.J. et al., What Controls the Optical Properties of DNA-Linked Gold Nanoparticle Assemblies?, J. Am. Chem. Soc., 122(19), 2000, pp. 4640-4650.

Tian, W. et al., Conductance spectra of molecular wires, Journal of Chemical Physics, 109(7), Aug. 15, 1998, pp. 2874-2882.

Tour, J.M. et al., Molecular Scale Electronics: A Synthetic/Computational Approach to Digital Computing, J. Am. Chem. Soc., 120(33), 1998, pp. 8486-8493.

Walter, D.G. et al., Photon-Gated Electron Transfer in Two-Component Self-Assembled Monolayers, J. Phys. Chem. B., 103(3), 1999, pp. 402-405.

Xia, Y. et al., Unconventional Methods for Fabricating and Patterning Nanostructures, Chem. Rev., 99(7), 1999, pp. 1823-1848.

Xia, Y. et al., Use of Electroless Silver as the Substrate in Microcontact Printing of Alkanethiols and its Applications in Microfabrication, Langmuir, 14(2), 1998, pp. 363-371.

Yaliraki, S.N. et al., Conductance of Molecular Wires: Influence of Molecule-Electrode Binding, J. Am. Chem. Soc., 121(14), 1999, pp. 3428-3434.

Zhou, C. et al., Nanoscale metal/self-assembled monolayer/metal heterostructure, Appl. Phys. Lett., 71(5), Aug. 4, 1997, pp. 611-613.

Lenfant, S. et al., Molecular rectifying diodes from self-assembly on silicon, http://arxiv.org/abs/cond-mat/0305594, May 26, 2003, pp. 1-21.

McGovern, W.R. et al., Importance of Oxides in Carbon/Molecule/Metal Molecular Junctions with Titanium and Copper Top Contacts, Journal of The Electrochemical Society, 2005, pp. E176-E183, 152 (5).

Asbury, J.B. et al., Bridge Length-Dependent Ultrafast Electron Transfer from Re Polypyridyl Complexes to Nanocrystalline TiO2 Thin Films Studied by Femtosecond Infrared Spectroscopy, J. Phys. Chem. B, 2000, pp. 11957-11964, 104(50).

Ramakrishna, S. et al., Bridge mediated ultrafast heterogeneous electron transfer, Chemical Physics Letters, 2002, pp. 242-250, 351.

* cited by examiner

ELECTRONIC JUNCTION DEVICES FEATURING REDOX ELECTRODES

The present application is a continuation-in-part of U.S. patent application Ser. No. 10/795,904, filed Mar. 8, 2004, now U.S. Pat. No. 7,141,299, which is incorporated herein by reference.

TECHNICAL FIELD OF THE INVENTION

The present invention is in the field of molecular electronics, a subset of the general field of microelectronics. Specifically, the present invention is in the field of electronic junction devices.

BACKGROUND OF THE INVENTION

A central effort in the field of molecular electronics has been the investigation of molecules as rectifiers, switches, storage devices, etc., in microelectronic applications. The goal of the present invention is to provide a means to alter junction conductivity via a chemical change induced by an electrical stimulus.

Electron transport (ET) through molecules in molecular junctions is fundamental to the area of molecular electronics, and understanding the relationship between molecular structure and transport is a prerequisite to the eventual design of molecular circuit components. The factors which determine ET through molecules oriented between metallic contacts has been investigated in single molecule devices based on scanning probe microscopy, as well as molecular junctions containing $10^3$-$10^{12}$ molecules in parallel. It is clear from the results reported to date that ET depends on molecular structure as well as the nature of the "contacts" between the molecules and the conductors. Several reviews on molecular junctions and molecular rectification have appeared, and research on ET mechanisms in such devices remains active.

Several laboratories have investigated "hybrid" devices involving the interface between a molecule and a conventional semiconductor such as silicon, gallium arsenide, and $TiO_2$. Research areas as diverse as dye sensitized solar cells and molecularly modified quantum dots also involve a combination of molecular and semiconductor properties. Our lab has investigated carbon/molecular/$TiO_2$/Au junctions in some detail, and compared them to similar junctions lacking the $TiO_2$ layer. By combining a molecular and semiconductor layer in the junction, one can in principle exploit the distinct electronic properties of each material in a "molecular heterojunction". For example, robust negative differential resistance has been observed in polyphenylene vinylene/$TiO_2$ heterojunctions, with the phenomenon being attributed to alignment of energy levels between the PPV and $TiO_2$. We have described carbon/nitroazobenzene (NAB)/$TiO_2$/Au junctions in which electrons are transferred between the NAB and $TiO_2$ to produce rectification and conductance switching.

During both the spectroscopic and electronic characterization of Carbon/NAB/$TiO_2$/Au junctions, both transient and persistent conductance changes were observed, whose origin was not completely clear. Potential pulses applied to such junctions produced a transient current lasting a few msec, followed in some cases by a slow (10-100 msec) conductance increase which persisted for several minutes. This "memory" effect may have technological value as well as mechanistic consequences, and deserved further study. Although Raman Spectroscopy established that NAB is reversibly reduced and oxidized in NAB/$TiO_2$ junctions only ~8 nm thick, the fate of the $TiO_2$ accompanying NAB redox events was not amenable to Raman monitoring, and was not determined directly. It is clear from these investigations that electron injection into the $TiO_2$ film is directly involved in the electronic behavior of the junction, but the events accompanying injection are not yet evident, including their relationship to observed changes in junction conductance.

The present invention clearly defines the conductance changes which occur when carbon/molecule/$TiO_2$/Au heterojunctions are subjected to an applied electric field. Fluorene (FL) junctions were investigated rather than previously studied NAB devices in order to simplify the problem by reducing the possibility of redox reactions in the molecular layer. Carbon/FL/$TiO_2$/Au junctions were compared to carbon/$TiO_2$/Au analogs to determine the influence of the FL layer on electronic behavior. In addition, a carbon/$Al_2O_3$/$TiO_2$/Au junction was investigated as an analog with a high-barrier insulator in place of the FL layer.

In view of the present disclosure or through practice of the present invention, other advantages may become apparent.

SUMMARY OF THE INVENTION

In general terms, the present invention includes a solid-state electronic junction, devoid of electrolytic solution, comprising: (1) a first conductive component comprising: (a) a substrate having a contact surface; and (b) at least one layer of molecular units, wherein at least one layer of molecular units is attached to the contact surface through a type of association selected from the group consisting of: covalent bonding and strong electronic coupling; and (2) a second conductive component comprising a layer of at least one first metal-containing compound and at least one second metal-containing compound adjacent to, and in electrical communication with, the at least one layer of said molecular units, the electronic junction having a conductance that reversibly changes in response to an applied voltage across the electronic junction.

As used herein, the term "strongly coupled electronically" is used to indicate that the substrate(s) and monolayer share one or more common molecular orbitals, and thus that electrons are delocalized over both the monolayer and the substrate. "Strongly coupled electronically" can also be interpreted as a chemical bond between the substrate and the monolayer which is stable enough to permit switching of the monolayer and the conductance of electricity across the bond. The term also refers, in the case of an organic moiety, to electronic coupling that is at a level greater than the aliphatic equivalent of the bond in question. A conjugated bond is one example of strong electronic coupling. As used throughout, the term "conjugated" shall mean conjugated in its typical and traditional capacity except for instances where a metal or silicon substrate are employed. For a metal or silicon substrate, the use of the term conjugated shall be interpreted to mean that the metal-carbon, metal-oxygen, silicon-carbon or silicon-oxygen bond between the substrate and the monolayer are strongly coupled electronically.

In one embodiment of the electronic junction according to the present invention at least one layer of molecular units comprises a chemical structure that reversibly changes from a relatively non-conductive state to a relatively conductive state by the application of a stimulus.

In one embodiment of the electronic junction according to the present invention the layer of at least one first metal-containing compound and at least one second metal-containing compound reversibly changes from a relatively non-conductive state to a relatively conductive state by the application of a stimulus.

In one embodiment of the electronic junction according to the present invention the second conductive component is capable of storing a charge.

In one embodiment of the electronic junction according to the present invention the first conductive component is capable of storing a charge.

In one embodiment of the electronic junction according to the present invention the molecular units comprise a chemical structure having at least one aromatic group when in the relatively non-conductive state.

In one embodiment of the electronic junction according to the present invention the molecular units comprise a chemical structure that is selected from the group consisting of: substituted phenyl groups, unsubstituted phenyl groups, substituted benzyl groups, unsubstituted benzyl groups, substituted phenolic groups, unsubstituted phenolic groups, substituted metalloporphyrin rings, unsubstituted metalloporphyrin rings, substituted ferrocene groups and unsubstituted ferrocene groups.

In one embodiment of the electronic junction according to the present invention the molecular units comprise a chemical structure that is selected from the group consisting of: biphenyl groups, fluorene groups, anthracene groups, phenanthrene groups, polyphenylene groups, polynuclear aromatic hydrocarbon groups, nitrated biphenyl groups, azobenzyl groups, and nitroazobenzyl groups.

In one embodiment of the electronic junction according to the present invention the molecular units are chemically bonded to the contact surface of the substrate by a chemical bond having the formula: R—X wherein R is a metal, silicon or carbon atom of the substrate and X is an oxygen or carbon atom of the molecular unit.

In one embodiment of the electronic junction according to the present invention the substrate of the first conductive component comprises a material selected from the group consisting of: electrically conductive carbon, metals, metal alloys, and metal nitrides.

In one embodiment of the electronic junction according to the present invention the molecular units of a given layer are substantially the same length.

In one embodiment of the electronic junction according to the present invention the second conductive component is chemically bound to the second ends of at least one layer of molecular units.

In one embodiment of the electronic junction according to the present invention the molecular units in at least one layer are substantially parallel to one another.

In one embodiment of the electronic junction according to the present invention at least some of the molecular units form an arrangement of molecular orbitals such that the electronic junction is capable of functioning as a semiconductor.

In one embodiment of the electronic junction according to the present invention the first metal-containing compound is a metal.

In one embodiment of the electronic junction according to the present invention the first metal compound is a metal nitride.

In one embodiment of the electronic junction according to the present invention the first metal-containing compound is selected from the group consisting of: titanium, silver, gold, tungsten, chromium, copper, titanium nitride, silver nitride, gold nitride, tungsten nitride, chromium nitride, copper nitride, tantalum nitride, and tungsten/titanium alloy.

In one embodiment of the electronic junction according to the present invention the second metal-containing compound is a covalently-bonded metal compound.

In one embodiment of the electronic junction according to the present invention the covalently-bonded metal compound is selected from the group consisting of: titanium oxides, titanium nitrides, titanium sulfides, titanium halides, silver oxides, silver nitrides, silver sulfides, silver halides, gold oxides, gold nitrides, gold sulfides, gold halides, tungsten oxides, tungsten nitrides, tungsten sulfides, tungsten halides, chromium oxides, chromium sulfides, chromium halides, chromium nitrides, copper oxides, copper nitrides, copper sulfides, copper halides, tantalum nitrides, and tantalum oxides.

In one embodiment of the electronic junction according to the present invention the covalently bonded metal compound is selected from the group consisting of: metal oxides, metal nitrides, metal sulfides, and metal halides.

In one embodiment of the electronic junction according to the present invention the second metal-containing compound is an ionically-bonded metal compound.

In one embodiment of the electronic junction according to the present invention the ionically-bonded metal compound is selected from the group consisting of: silver chloride, copper (I) chloride, copper (II) chloride, and sodium chloride.

In one embodiment of the electronic junction according to the present invention the second conductive component additionally comprises at least one ion.

The present invention additionally includes a memory device for storing data comprising at least one electronic junction as described above.

In one embodiment, the memory device further comprises a current amplifier in electrical communication with at least one electronic junction.

In one embodiment of the memory device each electronic junction is present on a single plane in the memory device.

In one embodiment of the memory device each electronic junction represents a storage location for at least one bit of information.

In one embodiment of the memory device, the memory device comprises at least 1024 electronic junctions.

In one embodiment, the memory device is in electrical communication with a voltage source.

In one embodiment of the memory device, the voltage source is the output of an integrated circuit.

The present invention also includes a computer system comprising: a central processing unit; and at least one memory device, as described above, in electrical communication with the central processing unit.

In one embodiment, the computer system further comprises at least one additional component selected from the group consisting of: a display and a selector device.

The present invention also includes a method for storing data comprising the steps of: (a) providing a memory device, as described above; and (b) applying a voltage to the memory device at sufficient current to change the conductivity of at least one electronic junction in the memory device thereby generating an electronic junction having a changed conductivity.

In one embodiment of the method, the voltage is the output of a structure selected from the group consisting of: logic gates and integrated circuits.

One embodiment of the method additionally comprises the step of detecting the conductivity of the electronic junction having a changed conductivity thereby reading out the data stored therein.

In one embodiment of the method, detecting the conductivity of the electronic junction having a changed conductivity does not change the conductivity of the electronic junction having a changed conductivity.

DETAILED DESCRIPTION OF THE PREFERRED EMBODIMENT(S)

In accordance with the foregoing summary of the invention, the following presents a detailed description of the preferred embodiment of the invention which is presently considered to be its best mode.

Experimental

All junctions were of the "crossed junction" type which has been described in detail previously. In all cases the junctions were formed at the intersection of a 1 mm wide strip of pyrolyzed photoresist film (PPF) and a 0.5 mm strip of Au and TiO$_2$ oriented perpendicular to the PPF, to yield a junction area of 0.005 cm$^2$. PPF is structurally similar to glassy carbon, with <0.5 nm surface roughness and a resistivity of 0.006 Ω-cm. The TiO$_2$ was deposited from rutile with an electron beam evaporator at a rate of 0.03 nm/sec. After initial pump-down to ~4×10$^{-6}$ torr, the e-beam chamber was backfilled with ultra high purity O$_2$ to ~1×10$^{-5}$ torr during TiO$_2$ deposition. The thickness of the TiO$_2$ layer was determined by an AFM line profile of the pattern formed by TiO$_2$ deposition through a fine wire mesh to be 5.2±0.25 nm. Au was deposited through the same shadow mask as the TiO$_2$ at 0.1 nm/sec and a backpressure of 4×10$^{-6}$ torr for a thickness of ~12 nm. XPS of the TiO$_2$ showed only Ti$^{IV}$, with no observable Ti$^{II}$ or Ti$^{III}$. The fluorene layer was deposited on PPF from its diazonium ion precursor using conditions which yielded a monolayer with a thickness of 1.7 nm, as determined by AFM "scratching". Junctions will be designated according to their composition as follows: PPF/FL/TiO$_2$/Au, or PPF/Al$_2$O$_3$/TiO$_2$/Au. In all cases the thicknesses of various layers were as follows: PPF, 1-2 µm; FL, 1.7 nm; TiO$_2$, 5.2 nm; Al$_2$O$_3$, 3 nm; Au, 12 nm.

Figure 1A:
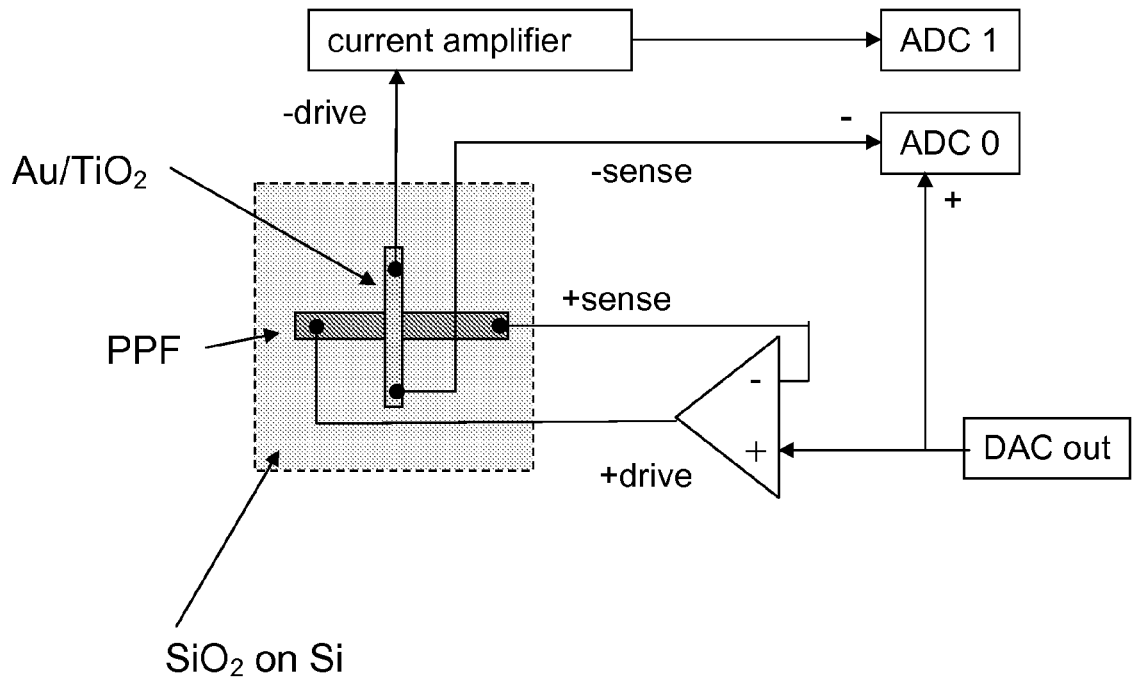
FIG. 1A provides a schematic diagram of one junction embodiment in accordance with the present invention. This schematic displays a "4-wire" arrangement which corrects for ohmic errors in the leads of the "crossed junction" geometry. DAC applies the bias, while ADC 0 monitors the iR-corrected voltage across the junction.
Figure 1B:
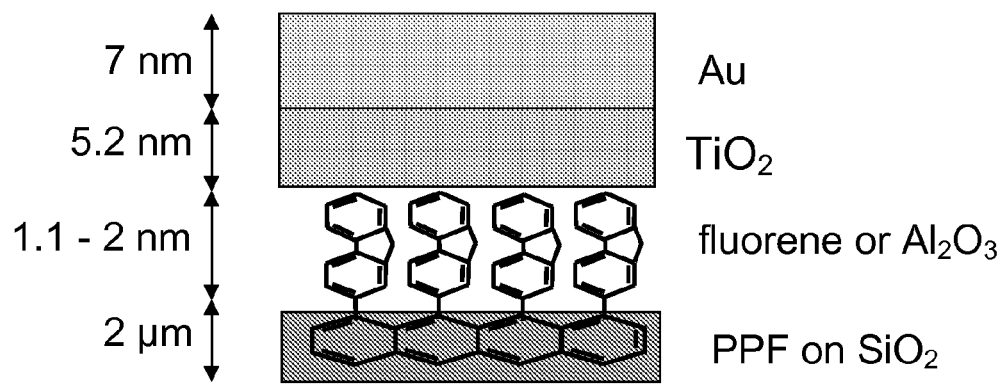
FIG. 1B is an illustration of the junction used in FIG. 1A with layer thicknesses specified. In several instances throughout the specification a similar structure is employed—some with the fluorene layer absent and some where it is replaced with $Al_2O_3$.

Electronic characterization was performed with the "4-wire" configuration shown in FIG. 1. The actual bias across the junction was measured differentially by a Labview data acquisition board, in order to correct for ohmic voltage losses in the PPF and Au leads. The operational amplifier was useful for active compensation of PPF resistance, which was important for obtaining accurate voltage pulses. The current amplifier was a Stanford Research Systems model 570, with a bandwidth of 1 MHz. For the experiments involving low temperature the sample was positioned on a LN$_2$ cooled copper stage heated by a cartridge heater controlled by a thermocouple positioned next to the sample. The J/V curves obtained as a function of temperature were acquired with a "3-wire" configuration, with the "-sense" input the ADC0 being grounded, due to differences in the apparatus. In all figures, the voltage is plotted as PPF relative to Au, and the current as A/cm$^2$ for the 0.005 cm$^2$ junction area. Each sample had 8-12 junctions and approximately one out of twenty junctions was rejected due to anomalously high current density. For eight different PPF/FL/TiO$_2$/Au samples, the reproducibility of the accepted junctions was evaluated by determining the mean voltage at which the current density crossed 0.016 A/cm$^2$, along with the standard deviation of this voltage. For positive bias, the mean voltage was 2.19±0.16 V, and for negative bias, it was 1.76±0.20 V. All electronic characterization was carried out in ambient air. Junction resistance increased slowly following e-beam deposition, but stabilized in ~1 week in ambient air, provided the humidity was not high. The junctions used for electronic characterization were between 1 and 4 weeks old.

Results

Figure 2A:
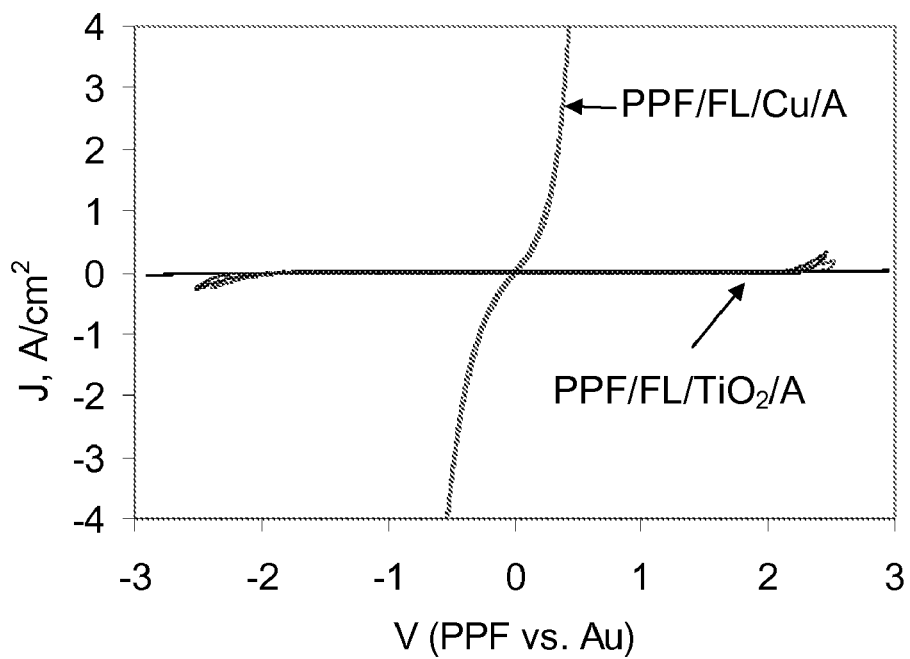
FIG. 2A compares the current density/voltage (J/V) curves for a PPF/FL/Cu/Au junction at a scan rate of 100 V/sec and a PPF/FL/TiO$_2$/Au junction at scan rates of 1, 10, and 1000 V/sec, as indicated. For FIGS. 2A-D, all scans were initiated in the positive direction and voltage is PPF relative to Au.
Figure 2B:
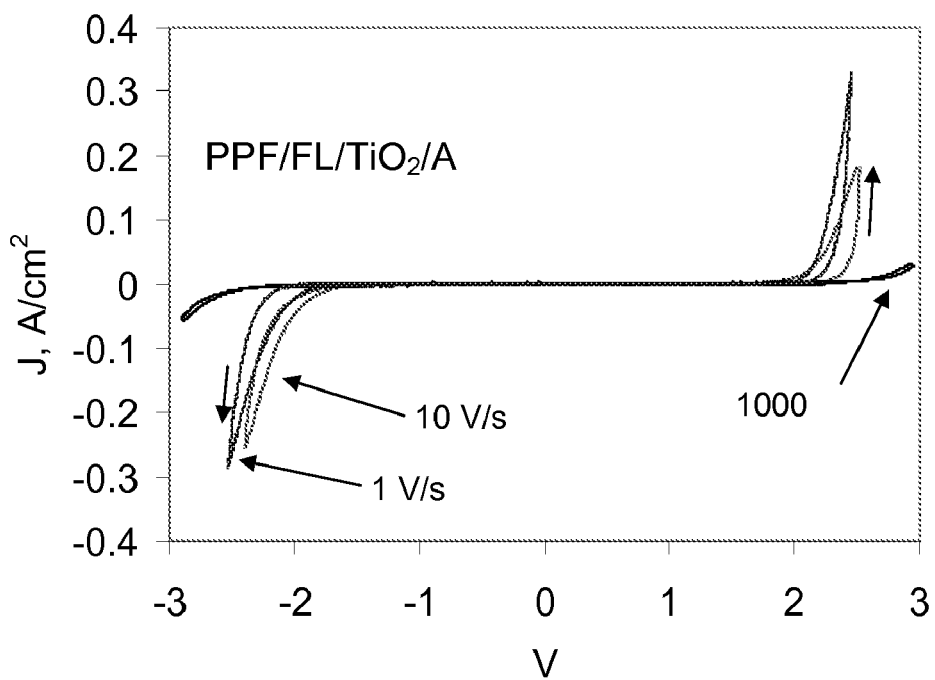
FIG. 2B is a close-up of the PPF/FL/TiO$_2$/Au curves from FIG. 2A with an expanded current density scale at various scan rates. The curve for the PPF/FL/Cu/Au junction is not present in this figure.

In all cases, the junctions investigated with current/voltage scans and pulse experiments were of three types which were prepared identically except for the "molecular" layer: PPF/TiO$_2$/Au, PPF/FL/TiO$_2$/Au, and PPF/Al$_2$O$_3$/TiO$_2$/Au. These cases were chosen to represent (1) a semiconducting oxide (TiO$_2$) alone, (2) a fluorene monolayer added to the TiO$_2$ layer, and (3) a high barrier oxide (Al$_2$O$_3$) substituted for the fluorene monolayer. FIGS. 2A and 2B show the J/V response as a function of scan rate for PPF/FL/TiO$_2$/Au molecular junctions. At high scan rate, the current density is relatively small over the range of ±3 V. Beyond 3 V at either polarity the junction broke down, even at 10$^4$ V/sec, to yield a sudden, irreversible increase in current. A J/V response for a PPF/FL/Cu/Au junction containing 30 nm of Cu but no TiO$_2$ is included in FIG. 2A to show that the TiO$_2$ greatly attenuates the observed current[47]. At slower scan rates the current increased significantly for |V|>2 V, and showed substantial hysteresis (apparent in the expanded scales in FIGS. 2B and 2C). When the fluorene layer was absent (FIG. 3D) the scan rate dependence and the hysteresis were substantially less pronounced.

Figure 3A:
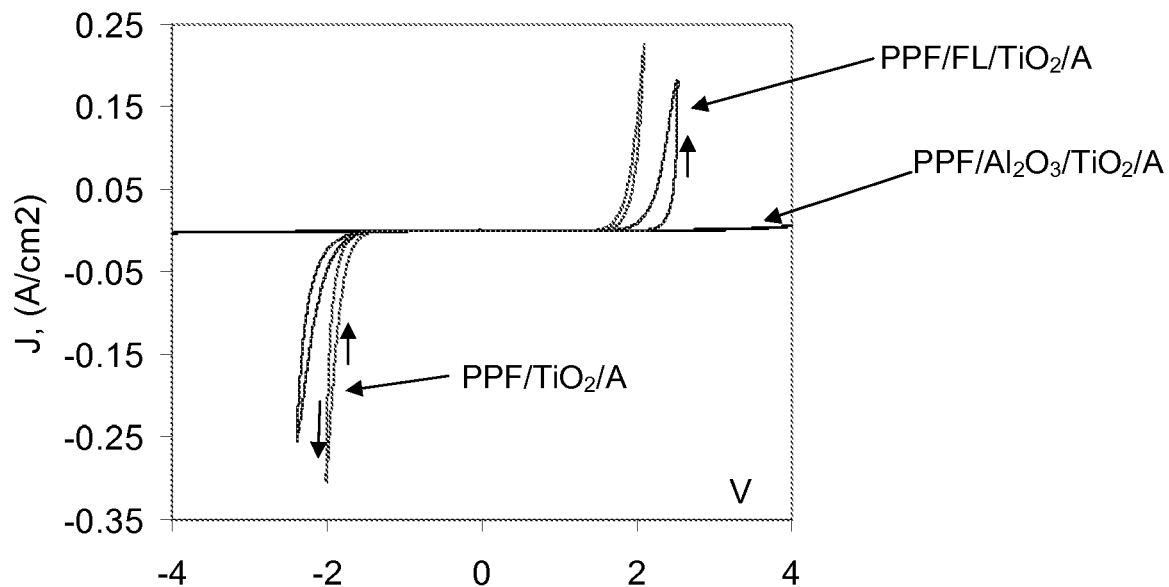
FIG. 3A compares the J/V curves for PPF/FL/TiO$_2$/Au, PPF/Al$_2$O$_3$/TiO$_2$/Au, and PPF/TiO$_2$/Au junctions at a scan rate of 10 V/sec. Arrows indicate scan direction.

Current density/voltage (J/V) curves obtained at a relatively slow scan rate of 10 V/sec are shown in FIG. 3A for the three junction types. The Al$_2$O$_3$/TiO$_2$ junction behaved as an insulator with a maximum current density <0.005 A/cm$^2$ over the range ±4 V. The TiO$_2$ junction had low conductance for the range of -1.5<V<1.5 with a sharp increase in current for |V|>2 V. The FL/TiO$_2$ junction exhibits similar behavior, but with a higher |V| required for significant current density, and both the TiO$_2$ and FL/TiO$_2$ junction exhibit hysteresis. For fast scans at 1000 V/sec, the results for FL/TiO$_2$ and TiO$_2$ junctions were qualitatively similar to the 10 V/s scans, but with less hysteresis and a higher voltage where significant current densities were observed. The Al$_2$O$_3$/TiO$_2$ junction showed very different J/V behavior at 1000 V/sec than at 10 V/sec, with a peak observed during the negative scan at approximately -3 V. The variation of J/V response with scan rate indicates a dynamic system, with the conductance changing during voltage scans to yield hysteresis. For example, during the positive scan at 10 V/sec for the FL/TiO$_2$ case shown in FIG. 3A, the current increases at ~2.4 V, then is larger during the negative going scan after reversal at +2.5 V than it was on the initial positive scan. This behavior is quite different from that observed for the analogous PPF/FL/Cu junction, in which the current is much larger (~5 A/cm$^2$ at 0.5 V), exhibits minimal hysteresis, and is invariant with scan rate or direction except for a capacitive component at high scan rates[47].

Figure 5A:
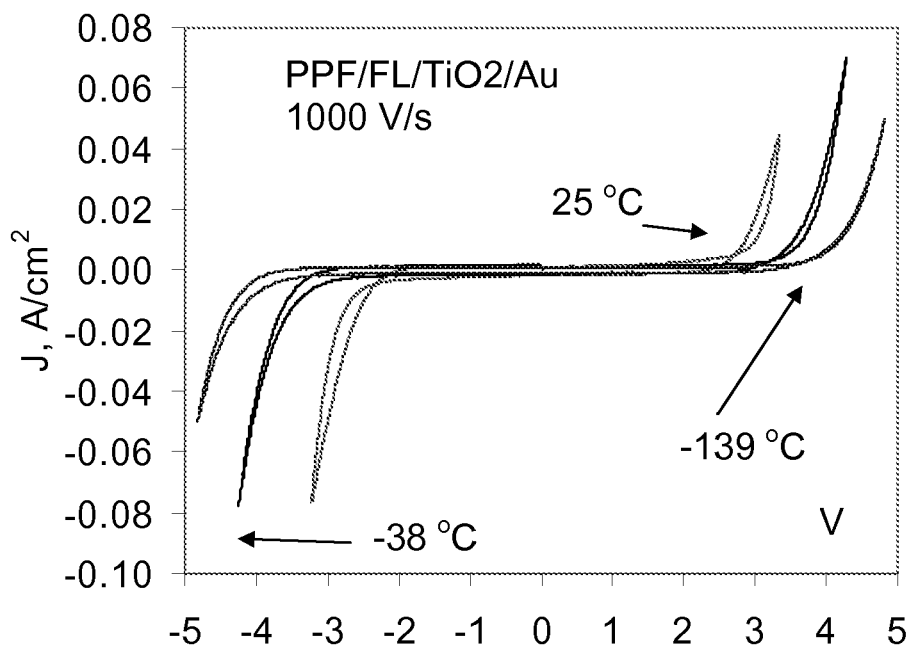
FIG. 5A illustrates the temperature dependence of the J/V curve for a PPF/FL/TiO$_2$/Au junction at a scan rate of 1000 V/sec.
Figure 5B:
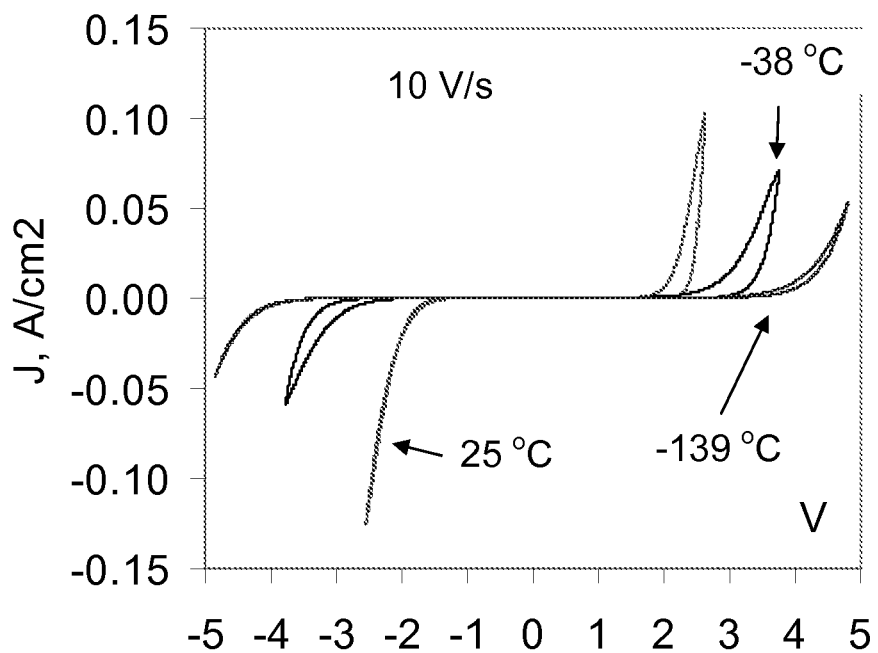
FIG. 5B illustrates the temperature dependence of the J/V curve for a PPF/FL/TiO$_2$/Au junction at a scan rate of 10 V/sec.
Figure 5C:
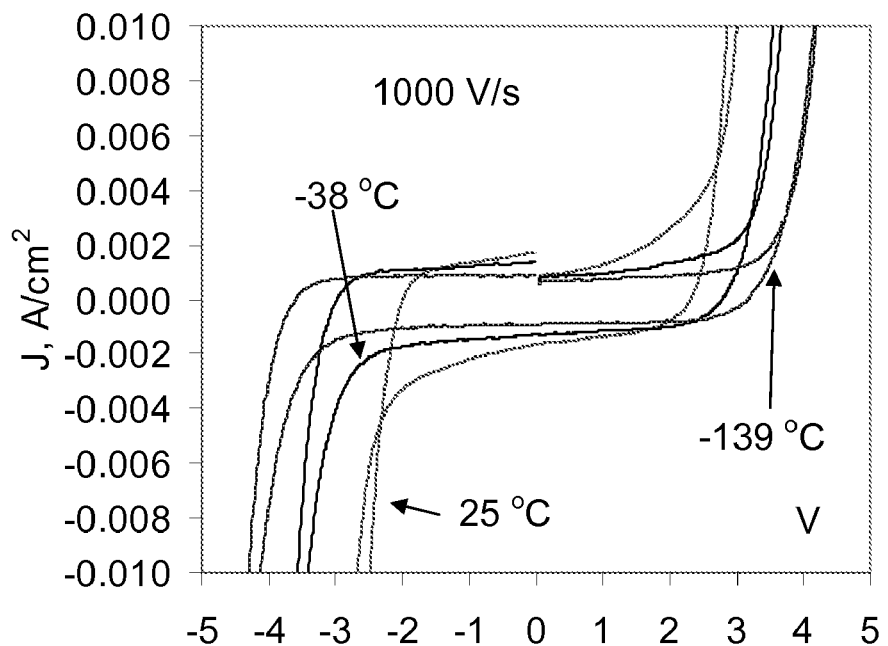
FIG. 5C is a close-up of a portion of FIG. 5A.
Figure 5D:
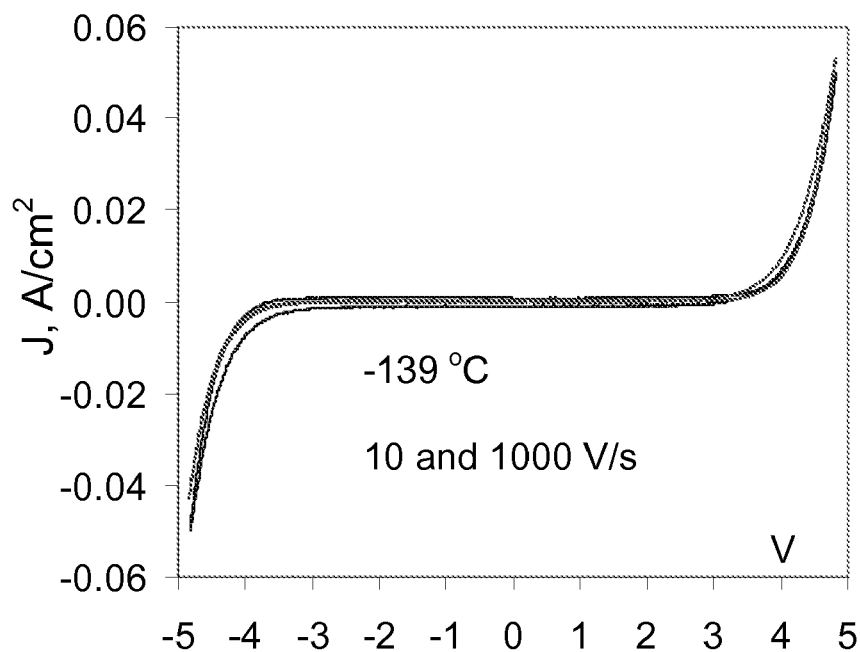
FIG. 5D compares the J/V curves for the PPF/FL/TiO$_2$/Au junction at scan rates of 10 and 1000 V/sec at a temperature of −139° C.
Figure 6A:
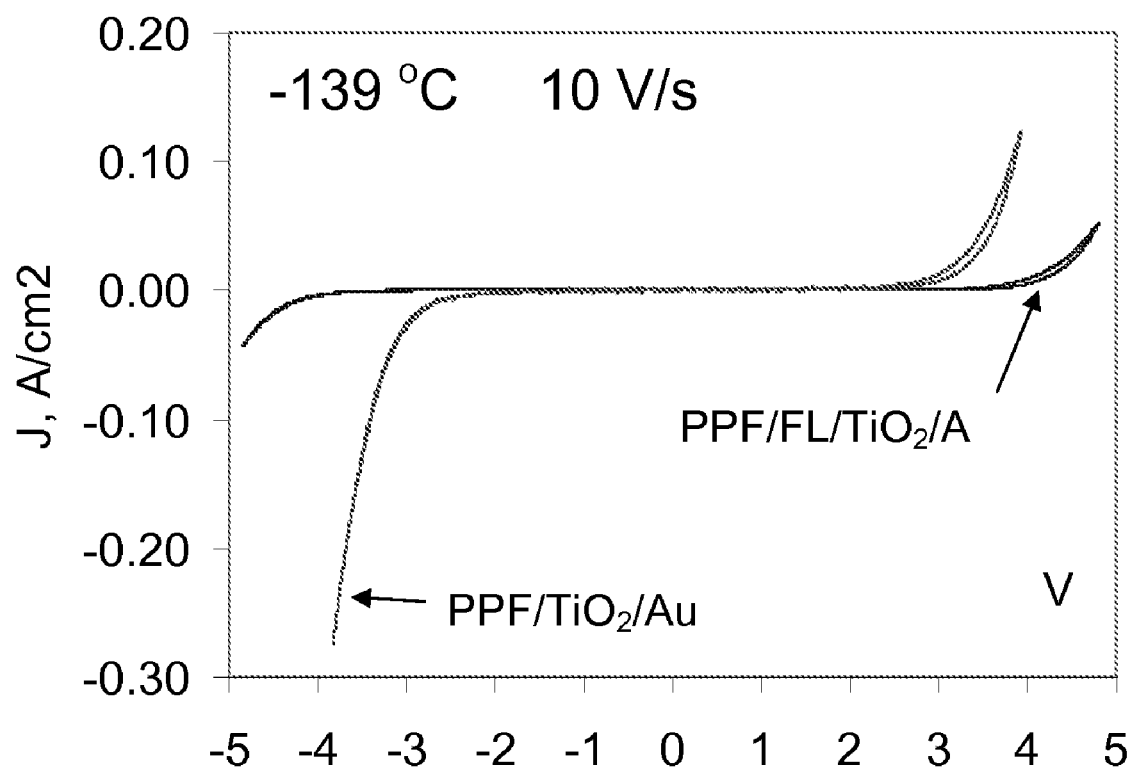
FIG. 6A compares the 10 V/sec J/V curves for a PPF/TiO$_2$/Au junction and a PPF/FL/TiO$_2$/Au junction at a temperature of −139° C.
Figure 6B:
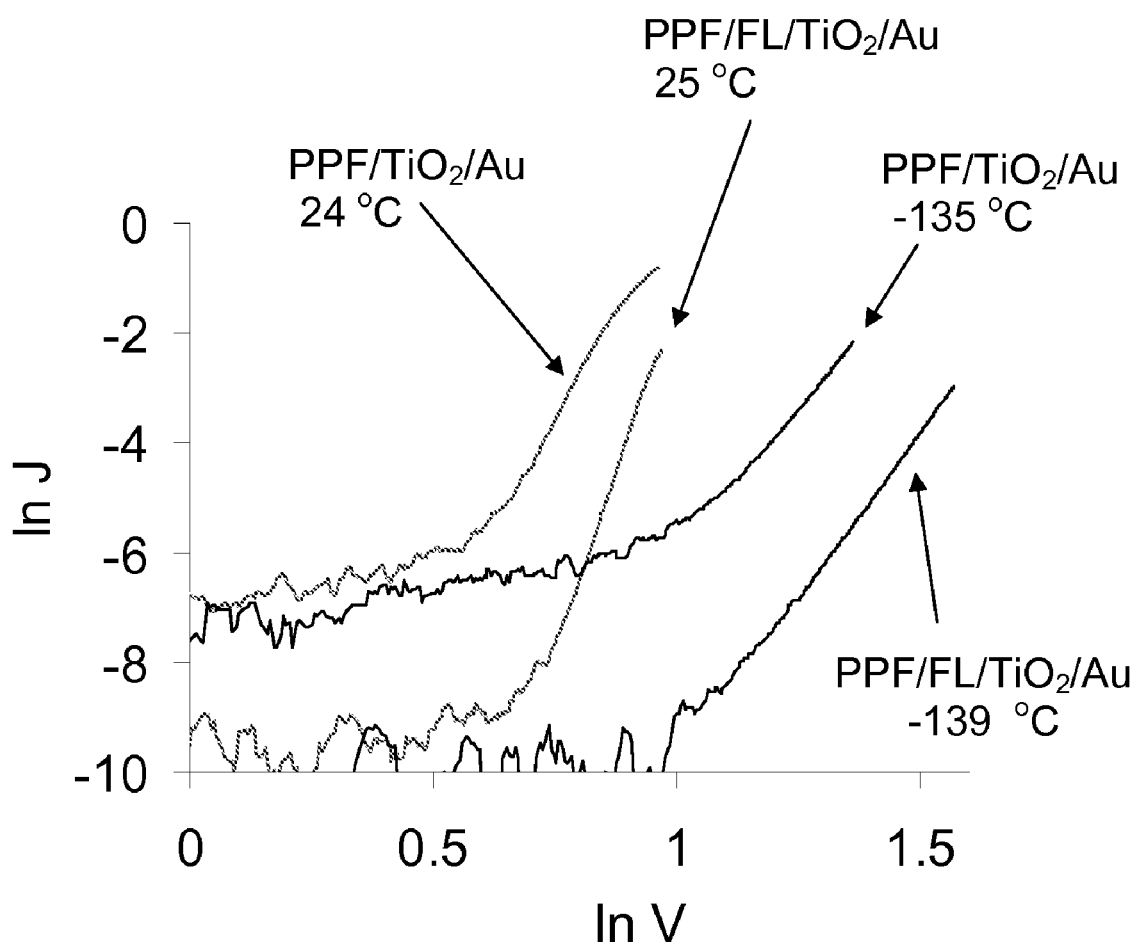
FIG. 6B plots ln J vs. ln V for the initial positive scan for the PPF/TiO$_2$/Au and PPF/FL/TiO$_2$/Au junctions. Note that the ln J values below −6 at 25° C. and −9 at −135° C. are not meaningful, due to the dynamic range constraints of the current amplifier.

Additional evidence for structural dynamics is provided by the temperature dependence shown in FIGS. 4 and 5 for TiO$_2$ and FL/TiO$_2$ junctions, respectively. At low temperature (~-135° C.), the J/V curves are essentially identical for 10 and 1000 V/sec, with the only difference being a small capacitive current component at high scan rate. Note that relatively large current densities are observed (>0.2 A/cm$^2$) even at -135° C., albeit at higher bias than required at 25° C. In addition, hysteresis is nearly absent at -135° C., but increases at higher temperatures. FIG. 6 shows an overlay of TiO$_2$ and FL/TiO$_2$ junctions at low temperature, where the junctions appear to be structurally static. The fact that the J/V curves vary significantly with scan rate at room temperature, but are independent of scan rate at -135° C. implies that whatever structural changes are responsible for the scan rate variation are "frozen out" at the lower temperatures. FIG. 6B is a plot of ln(J) vs ln(V) for both junctions at room temperature and low temperature, as indicated in the figure. As noted in the discussion section, the slopes of such plots provide clues about the conduction mechanism.

Figure 2C:
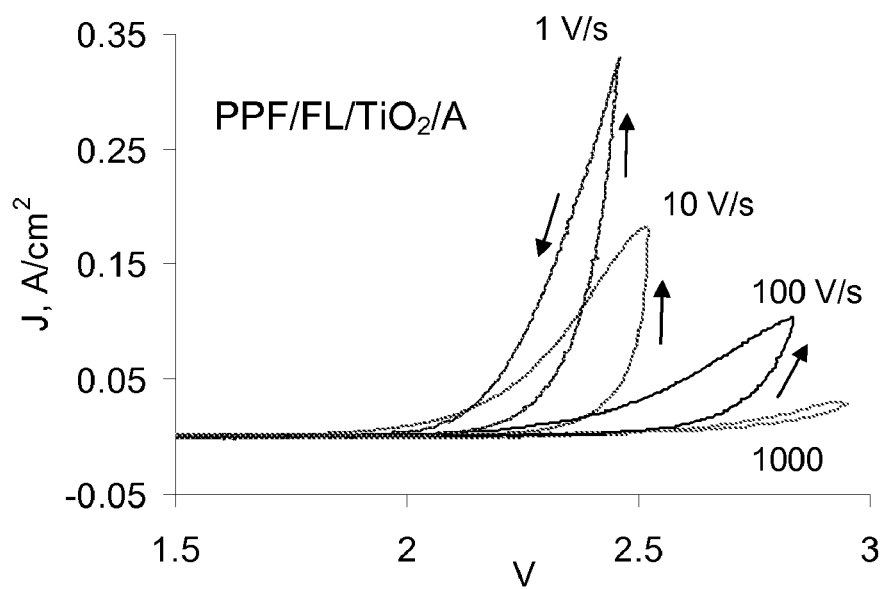
FIG. 2C illustrates partial current density/voltage curves for the PPF/FL/TiO$_2$/Au junction at scan rates of 1, 10, 100 and 1000 V/sec, as indicated.
Figure 2D:
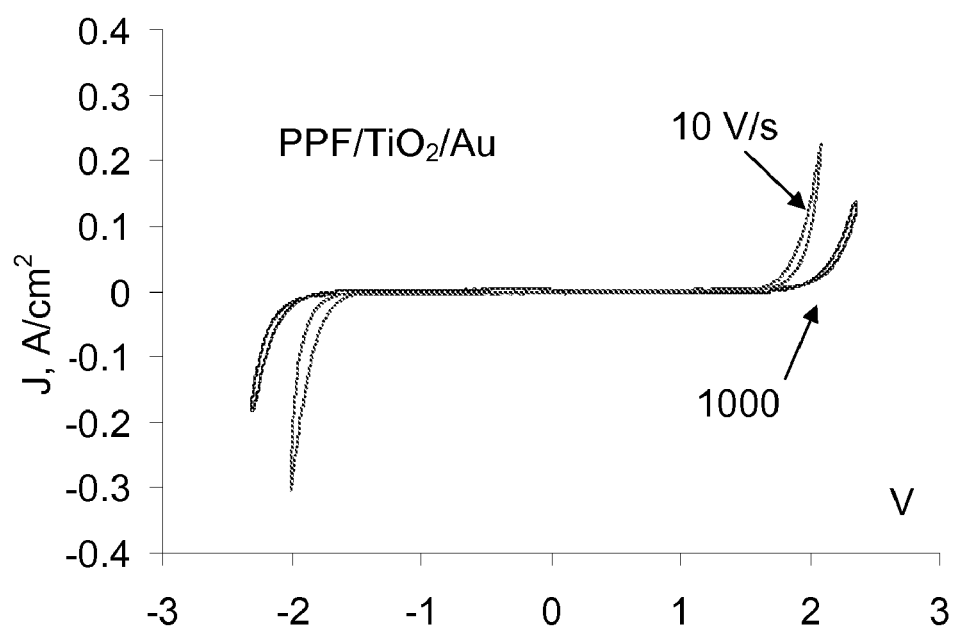
FIG. 2D provides current density/voltage curves for a PPF/TiO$_2$/Au junction at scan rates of 10 and 1000 V/sec, as indicated.
Figure 7A:
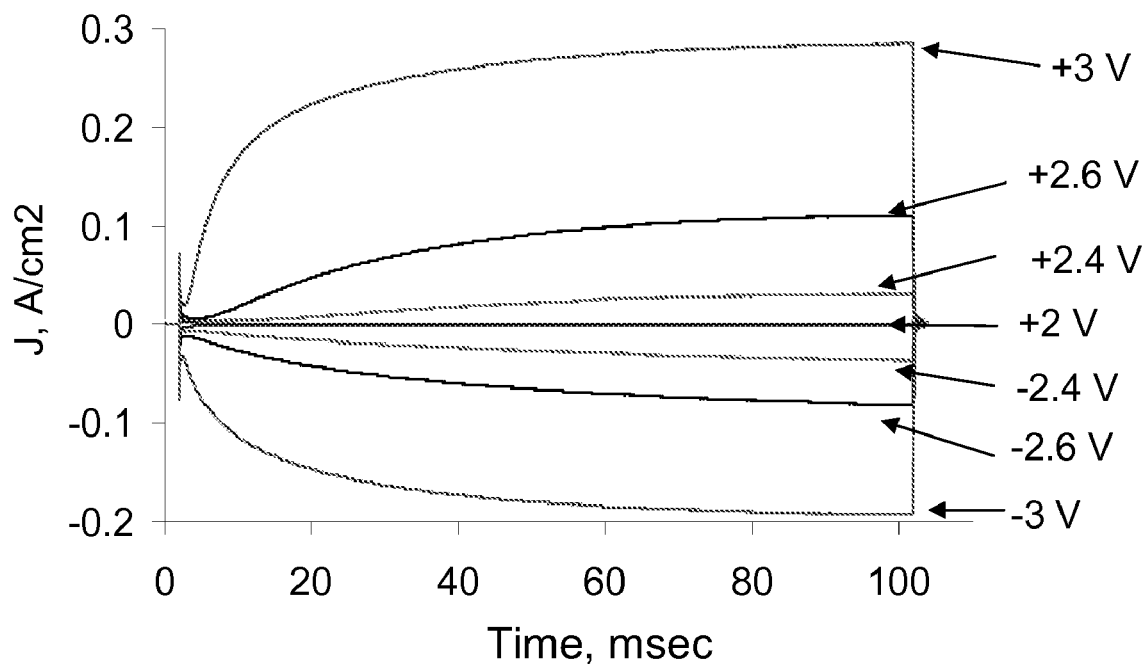
FIG. 7A presents the results of 100 msec duration voltage pulses of various amplitudes initiated at t=2 msec applied to a PPF/FL/TiO$_2$/Au junction.
Figure 7B:
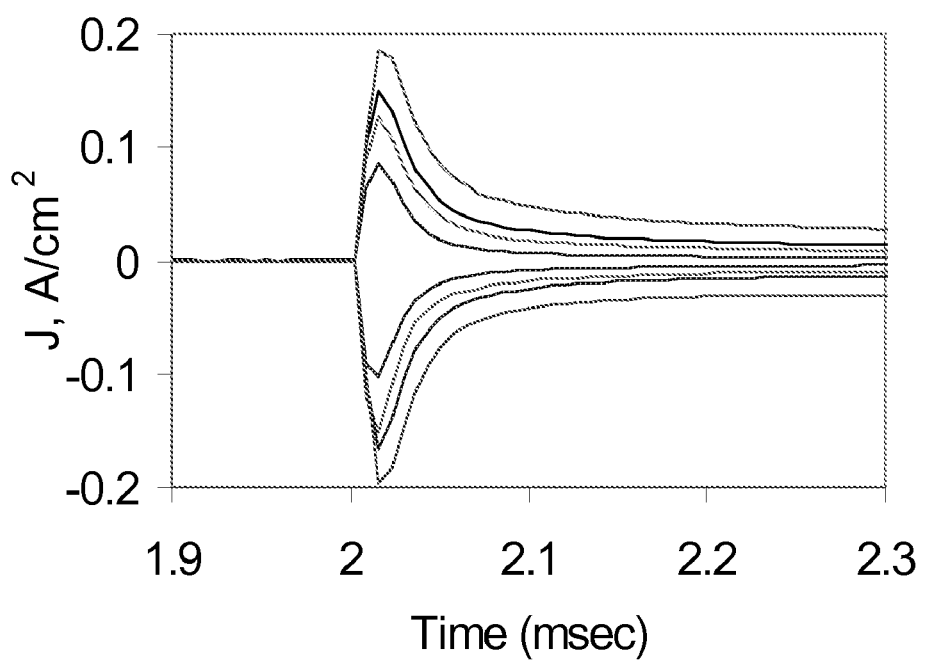
FIG. 7B illustrates the results shown in FIG. 7A on a different time scale.

The pronounced scan rate dependence of PP/FL/TiO$_2$/Au junctions apparent in FIGS. 2B and 2C implies that application of a voltage step to a fixed potential of 2-3 volts should result in a current response which increases with time. FIG. 7A shows the response to 10 msec pulses to ±2-3 volts then back to V=0. After an initial current spike lasting ~0.3 msec, the current density increases with time for |V|>2V. We reported previously the relatively slow increase in current for nitroazobenzene/TiO$_2$ junctions, and attributed them to redox reactions within the junction. As shown in FIG. 7B with faster time resolution, the current spike scales approximately with applied voltage. Although the slow response depends strongly on the composition of the junction (FIG. 7C), the fast transient does not vary greatly with FL or Al$_2$O$_3$ present.

For the moment, we focus on the fast transient current lasting <300 μsec. This transient is more easily observed as the "backstep", when the bias is returned to zero at the end of the forward voltage pulse. Since V=0 at this point, there is no DC current through the junction and only the fast transient is observed. Overlays of three "backstep" transients following 5 msec forward pulses to +2 V are shown for the three junction types in FIG. 8A, showing only the weak dependence on composition as long as TiO$_2$ was present. The magnitude of the backstep was independent of whether the slow "rise" in current was observed during the forward voltage pulse. FIG. 7B shows the integrated area of the backstep for a PPF/FL/TiO$_2$/Au junction as a function of both voltage and forward pulse duration. Once the pulse exceeds a few msec, the backstep charge is constant with pulse time, but increases with forward pulse voltage. Table 1 compares backstep charge for the three junction types for 100 msec pulses with several pulse amplitudes. As expected from FIG. 7C, the backstep charge is weakly dependent on composition, varying by a factor of ~2 for Al$_2$O$_3$/TiO$_2$, FL/TiO$_2$, and TiO$_2$ junctions following +2 V pulses. In addition, the forward and backstep areas are approximately equal, although the forward area was often difficult to measure due to the rise of DC current during the pulse. The magnitudes of the backstep charge vary from ~5 to ~18 μC/cm$^2$ for 1-3 V pulses, with 10 μC/cm$^2$ corresponding to 1×10$^{-10}$ moles/cm$^2$, or a density of ~10$^{19}$ e$^-$/cm$^3$ in a 5 nm thick TiO$_2$ layer.

TABLE 1

Backstep charge for 5 and 100 msec forward pulses

| coul/cm$^2$ | | $V_{forward}$ 5 msec | $Q_{forward}$ C/cm$^2$ 5 msec | $Q_{back}$, 100 msec |
|---|---|---|---|---|
| FL-TiO$_2$ | 1 | 2.06 × 10$^{-6}$ | −3.69 × 10$^{-6}$ | −4.10 × 10$^{-6}$ |
| | 2 | 7.17 × 10$^{-6}$ | −1.02 × 10$^{-5}$ | −1.22 × 10$^{-5}$ |
| | 3 | * | −1.57 × 10$^{-5}$ | −1.60 × 10$^{-5}$ |
| TiO$_2$ | 1 | 5.31 × 10$^{-6}$ | −6.88 × 10$^{-6}$ | −8.89 × 10$^{-6}$ |
| | 2 | * | | −9.21 × 10$^{-6}$ | −1.04 × 10$^{-5}$ |
| Al$_2$O$_3$/TiO$_2$ | | | | |
| | 2 | 2.74 × 10$^{-6}$ | −5.58 × 10$^{-6}$ | −6.59 × 10$^{-6}$ |
| | 3 | 2.78 × 10$^{-5}$ | −1.06 × 10$^{-5}$ | −1.83 × 10$^{-5}$ |
| | 4 | 6.48 × 10$^{-5}$ | −2.58 × 10$^{-5}$ | −3.72 × 10$^{-5}$ |

* pulse obscured by DC current

Figure 8A:
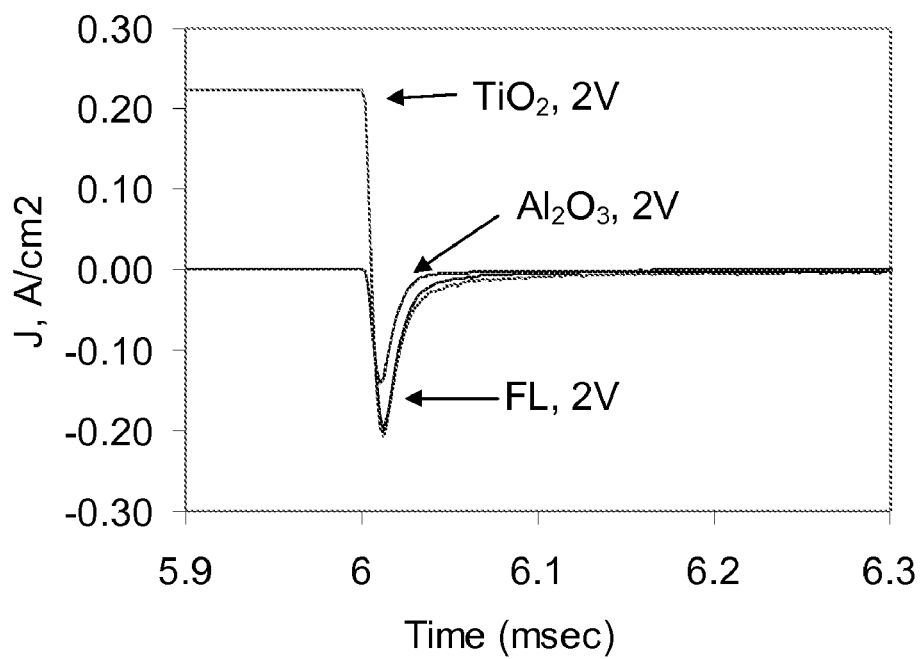
FIG. 8A illustrates the backstep pulse results for three TiO$_2$ containing junctions, forward pulse amplitude +2 V, 5 msec, then return to V=0 at 6 msec.
Figure 8B:
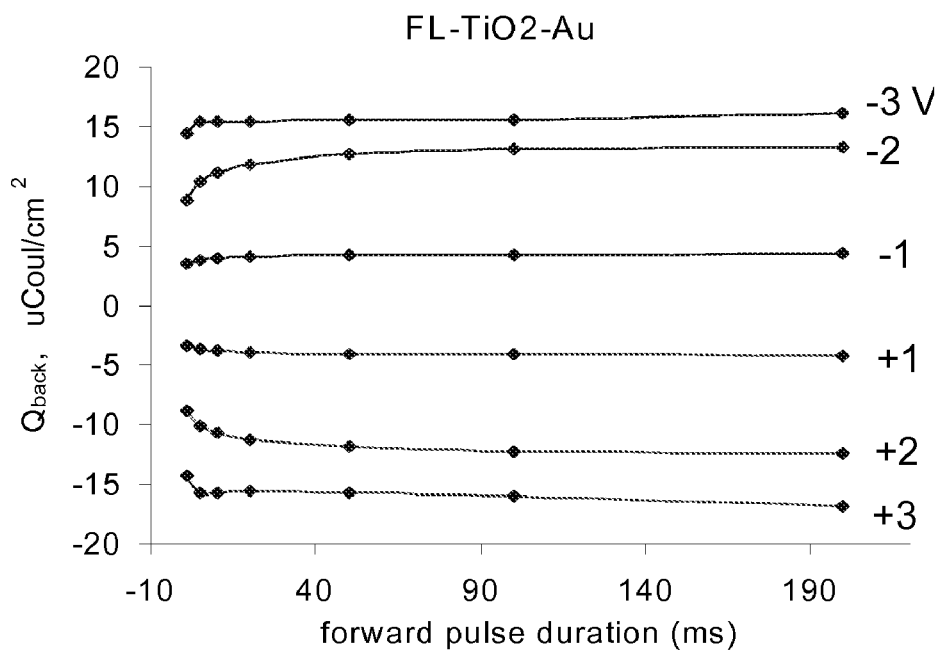
FIG. 8B provides the backstep pulse area in μCoul/cm$^2$, as a function of forward pulse time and voltage.
Figure 8C:
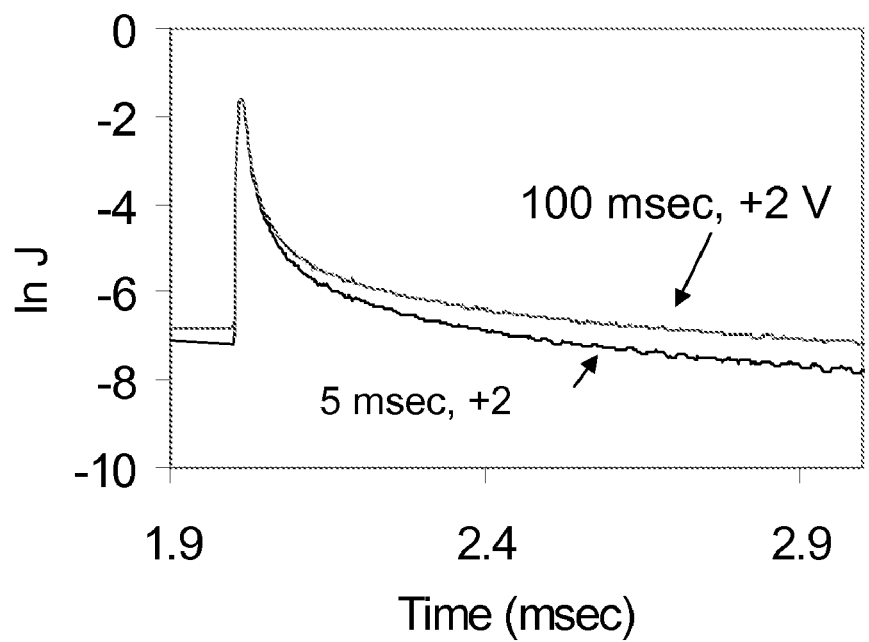
FIG. 8C provides a plot of ln (J) for backstep for +2 V forward pulses of 5 and 100 msec duration. (The time axis was offset so backstep started at 2 msec to permit comparison.)
Figure 8D:
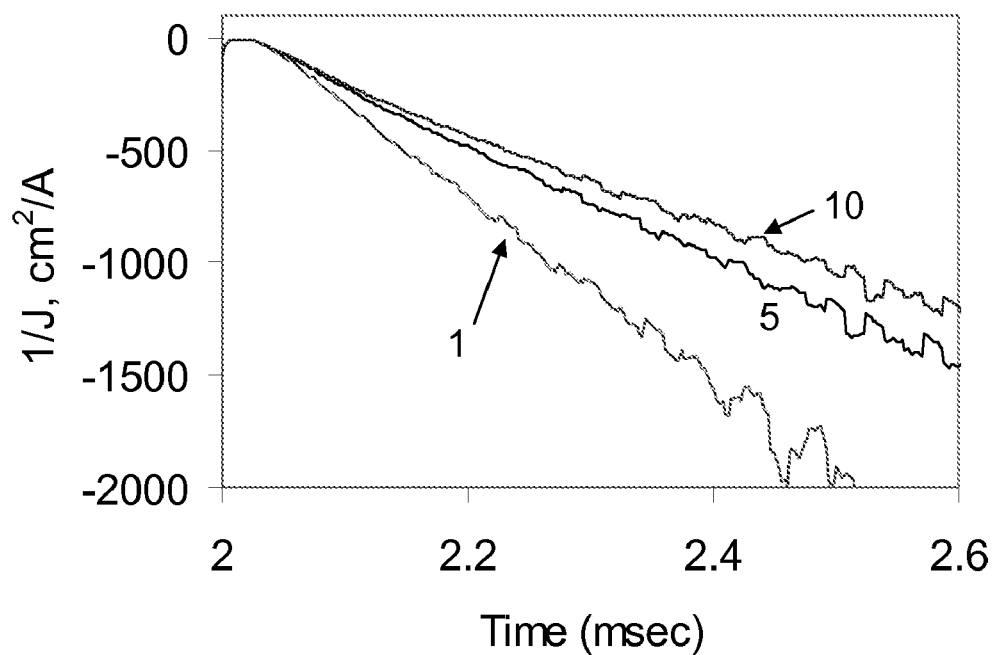
FIG. 8D provides plots of 1/J vs. time for backsteps of the indicated duration, with time axis offset so backstep started at 2 msec.

It is reasonable to suppose that the "fast" current transient is simply charging current for the parallel plate capacitor comprised of PPF and Au with a single or double dielectric layer between them. However, the decay is not the expected exponential for an RC response, with ln (J) vs t very nonlinear (FIG. 8C). The RC time constant for the junction area employed is <10 μsec, much faster than the observed decay. Furthermore, plots of 1/J vs t are linear (FIG. 8D), indicating a mechanism quite different from conventional RC charging.

Figure 9A:
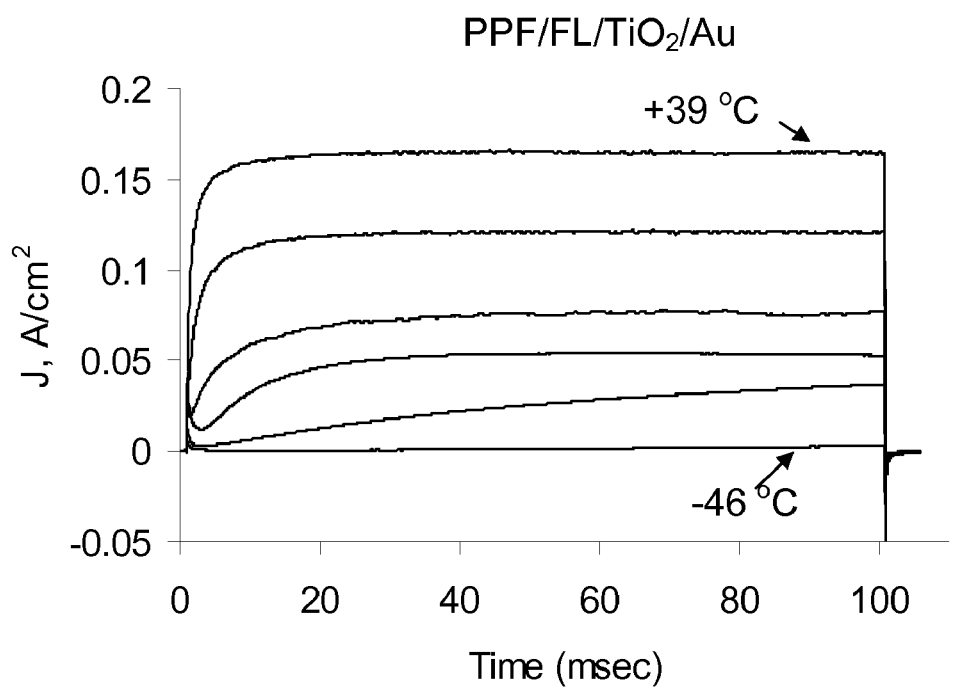
FIG. 9A illustrates the temperature dependence of pulse response for a PPF/FL/TiO$_2$/Au junction, +3V, 100 msec pulses, in order from top to bottom: +39, +27, +8, −9, −28, −46° C.
Figure 9B:
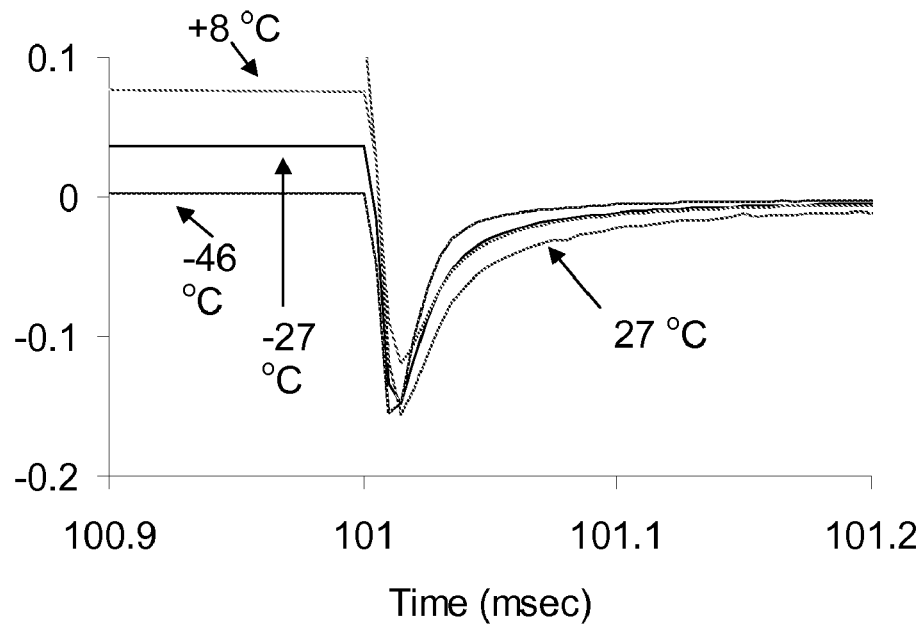
FIG. 9B provides a magnified view of illustration provided in FIG. 9A to show backstep pulses for the four temperatures indicated.
Figure 9C:
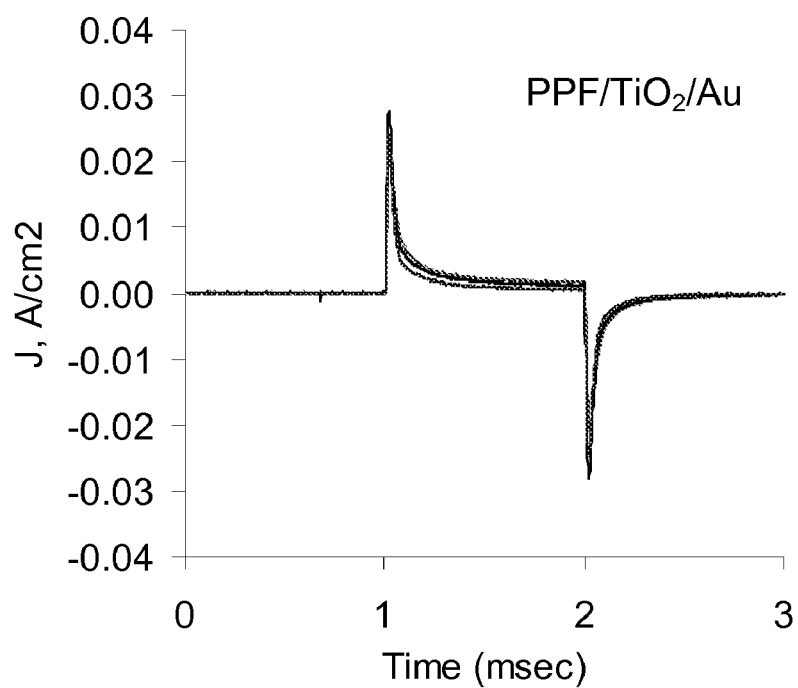
FIG. 9C illustrates the temperature dependence of pulse response for a PPF/TiO$_2$/Au junction, 1 msec pulses to +1V, three temperatures superimposed: 27, −37 and −149° C.

Insights into the mechanisms underlying the slow (1-100 msec) and fast (<0.1 msec) transients are provided by their temperature dependence. FIG. 9A shows that the increase in current which occurs over a 1-100 msec time scale is strongly temperature dependent for the PPF/FL/TiO$_2$/Au junctions. Once the temperature is decreased to below −60° C., the "slow" increase is absent. However, the fast transient is nearly independent of temperature, as shown for the backstep in FIG. 9B. The PPF/TiO$_2$/Au junctions also showed strong dependence of the "slow" pulse current on T, but the PPF/Al$_2$O$_3$/TiO$_2$/Au junctions had a low pulse current at all T. As shown in FIG. 9C, the fast transient of the PPF/TiO$_2$/Au junction was weakly dependent on temperature, for both the forward and back steps of a +1 V pulse. We attribute the fast transient to space charge capacitance associated with injection of electrons in TiO$_2$, as will be discussed in more detail below. After the parallel plate is charged in the first several microseconds after a positive change in bias, the space charge builds up for a few msec. When the bias is returned to zero for the "backstep", this space charge is dissipated over a similar ~msec time scale. The result is the symmetric fast transients apparent in FIGS. 7B and 9C.

Figure 10A:
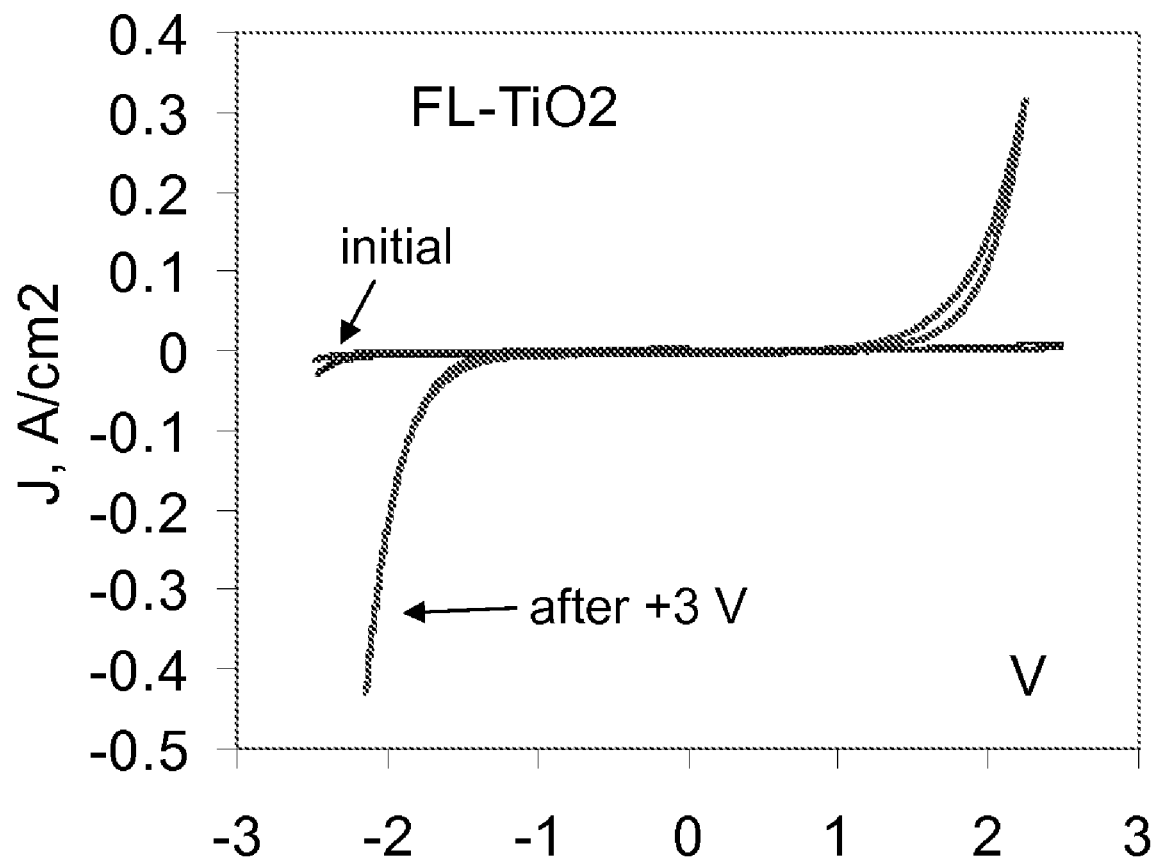
FIG. 10A illustrates the memory effect for a PPF/Fl/TiO$_2$/Au junction, constructed in accordance with the present invention, at room temperature. 1000 V/sec scans were acquired before and after 100 msec pulses to the indicated voltages.
Figure 10B:
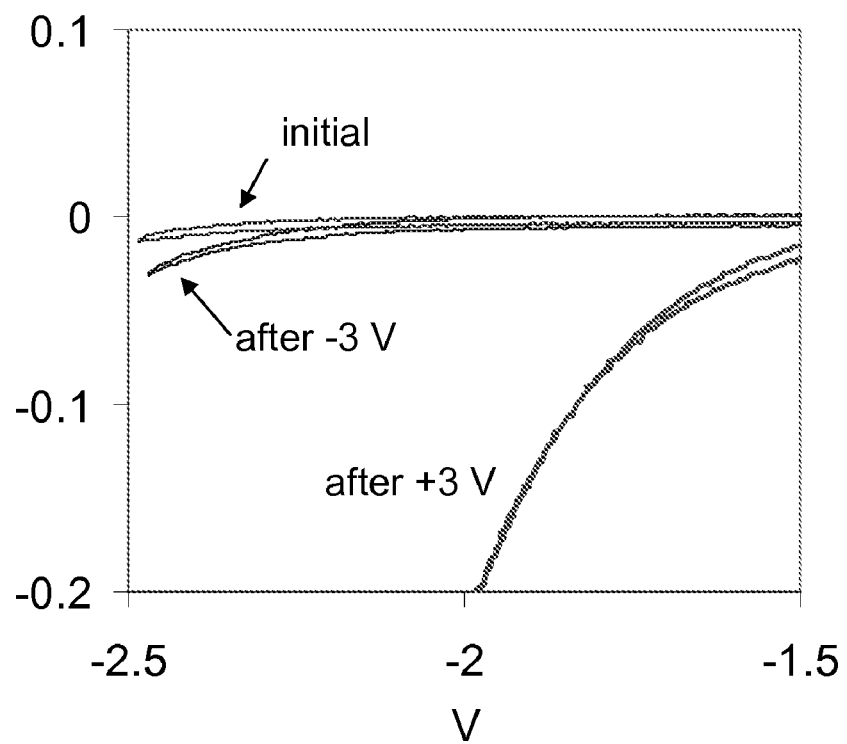
FIG. 10B provides a magnified portion of the illustration of FIG. 10A. The −3V pulse occurred ~2 sec after the +3 V pulse.
Figure 10C:
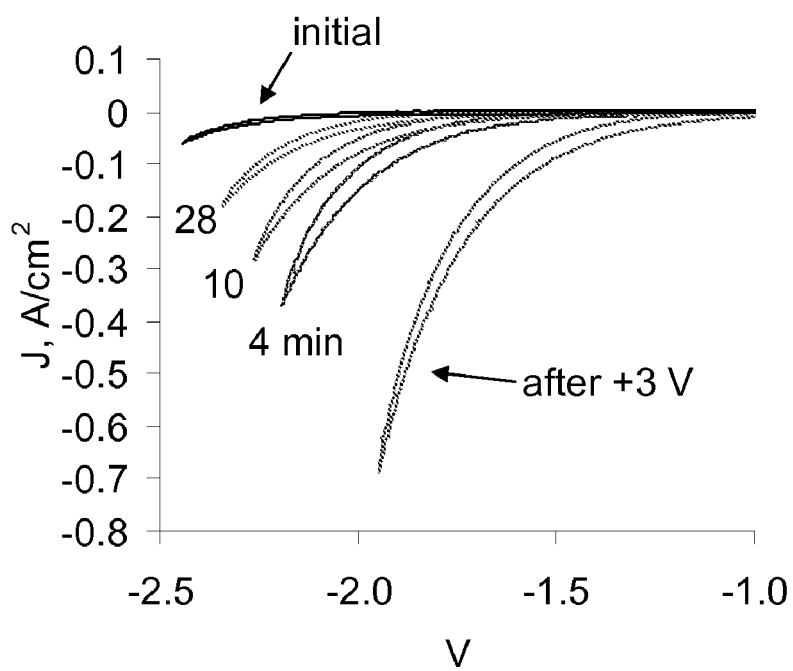
FIG. 10C illustrates the results of the junction used in FIG. 10A for repeated 1000 V/sec scans obtained at the indicated time (in minutes) after a 100 msec, +3 V pulse. The junction was held at V=0 between scans.

Turning our attention to the "slow" 1-100 msec pulse response, FIG. 10 shows the persistent changes in junction behavior following a 100 msec, +3 volt pulse. The initial scan of a PPF/FL/TiO$_2$/Au junction at 1000 V/sec (±2.5 V) shows low current density, consistent with FIG. 2. After a +3 V pulse lasting 100 msec, the conductance over the same voltage range increases dramatically, then fades slowly during repeated scans (FIG. 10C). The conductance at V=−2.5 is still elevated by a factor of ~5 over its initial value 28 minutes after the +3 V pulse. However, an "erase" pulse of −3V for 100 msec immediately returns the conductance to close to its initial value (FIG. 10B). The cycle of "set" (+3V) and "erase" (−3 V) pulses may be repeated hundreds of times, with little change in the observed J/V curves for the "set" and "erased" states. If the duration of the +3 V set pulse is shorter, the conductance change is decreased. For a 100 msec set pulse, the conductance increases by a factor of 67 at +1.9 V, but for 11 msec and 1 msec pulses, this factor is reduced to 4 and 2, respectively. Therefore, the magnitude of the conductance change correlates with the "slow" rise in current apparent in FIGS. 7A and 9A, in terms of approximate time scale.

Figure 11A:
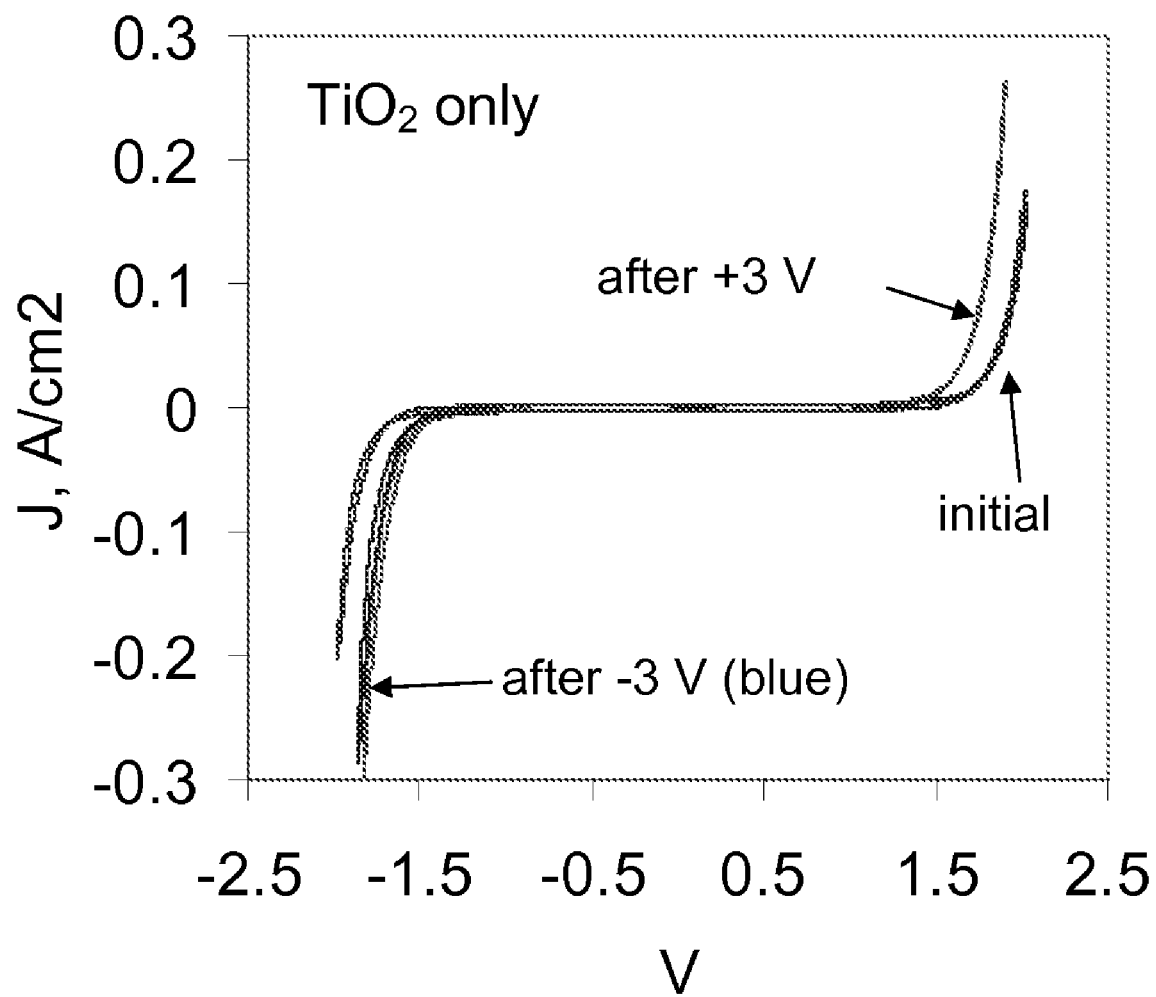
FIG. 11A illustrates the same sequence of pulses and scans as in FIG. 10A for a PPF/TiO$_2$/Au junction, 1000 V/sec, ±3V pulses.
Figure 11B:
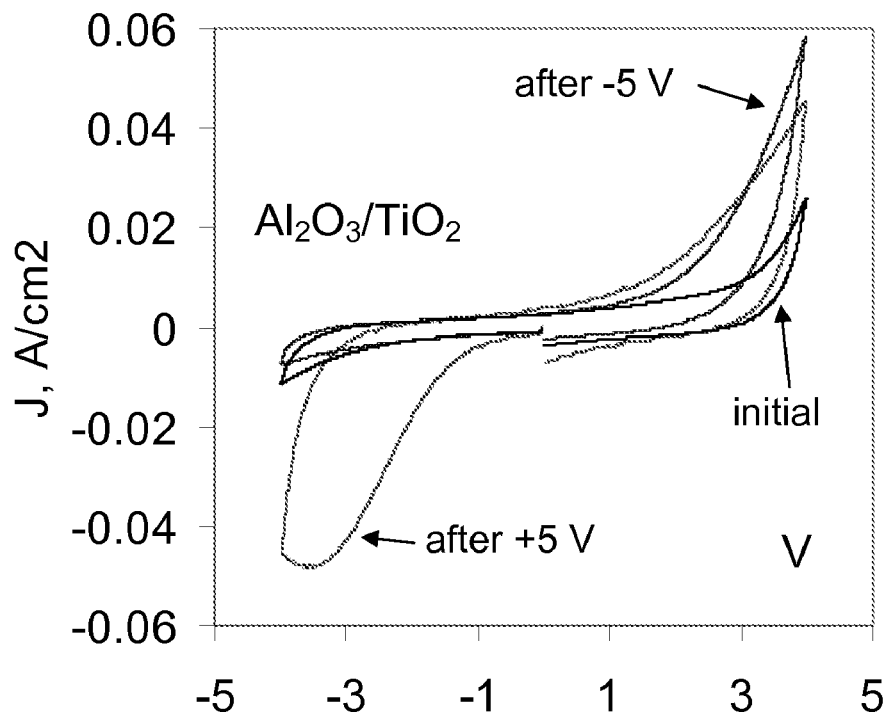
FIG. 11B illustrates the same sequence of pulses and scans as in FIG. 10A for a PPF/Al$_2$O$_3$/TiO$_2$/Au, 1000 V/sec scans initiated in the negative direction, and ±5V, 100 msec pulses.

As shown in FIG. 11A, this "memory" effect is nearly absent for the PPF/TiO$_2$/Au junction lacking fluorene. Small changes in conductance followed a +3 or −3 V pulse, and these decayed quickly, in <1 minute. For the PPF/Al$_2$O$_3$/TiO$_2$/Au junction (FIG. 11B), the insulating Al$_2$O$_3$ reduced the currents to much smaller values and persistent changes in conductance were not observed in response to "set" and "erase" pulses. However, a non-repeatable transient current was observed on the first negative 1000 V/scan after a "set" pulse. The area under this peak response was approximately 8.0×10$^{-5}$ coul/cm$^{-5}$, or 8.3×10$^{-10}$ moles/cm$^2$.

Figure 12A:
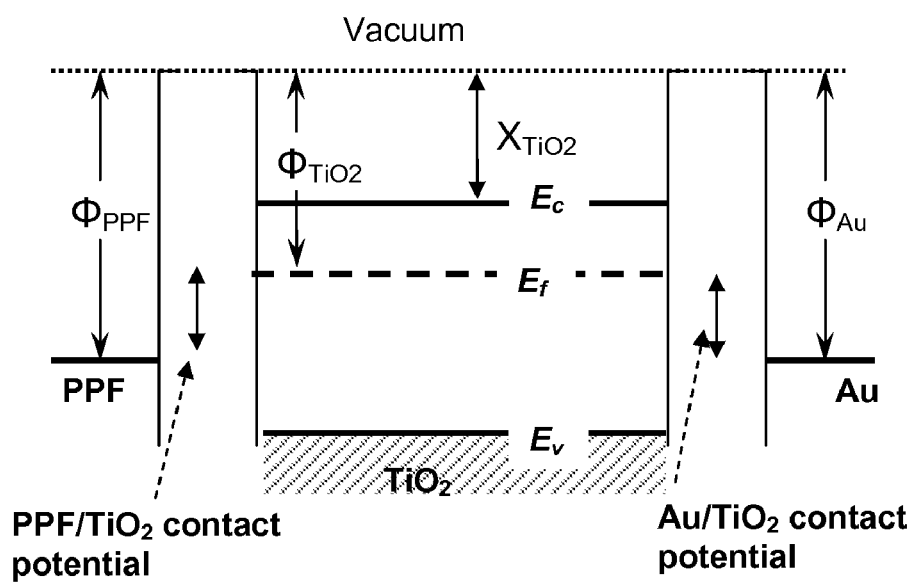
FIG. 12A provides the approximate energy level diagram at zero bias for the isolated materials. As used in FIGS. 12A through 12D, the vertical scale is electron energy referenced to the vacuum level, with higher energy upward. $E_c$, $E_f$, $E_v$ are the TiO$_2$ conduction, Fermi, and valence band energies; $\phi_{Au}$, $\phi_{PPF}$ are the Au and PPF work functions. $X_{TiO2}$ is the TiO$_2$ electron affinity, $\phi_{con}$ is the TiO$_2$/Au contact barrier, and FL LUMO is the lowest unoccupied molecular orbital of Fluorene.
Figure 12B:
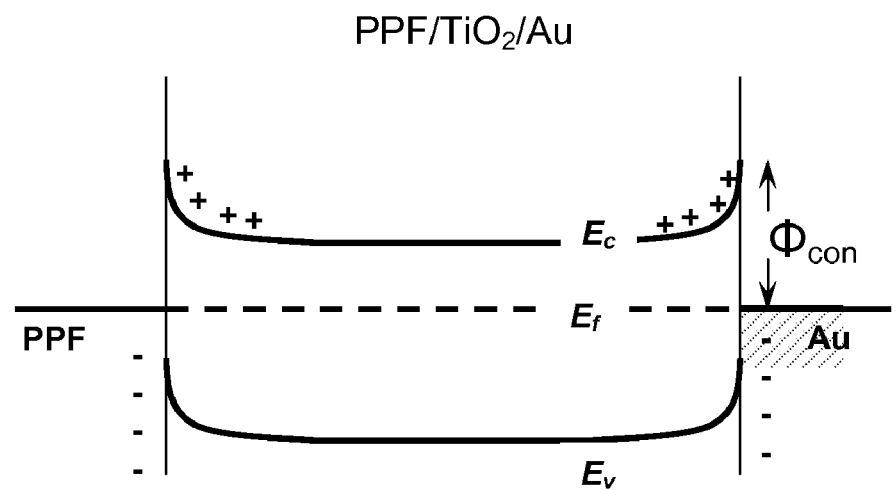
FIG. 12B provides the approximate energy level diagram at zero bias for a PPF/TiO$_2$/Au junction without traps at thermal equilibrium.
Figure 12C:
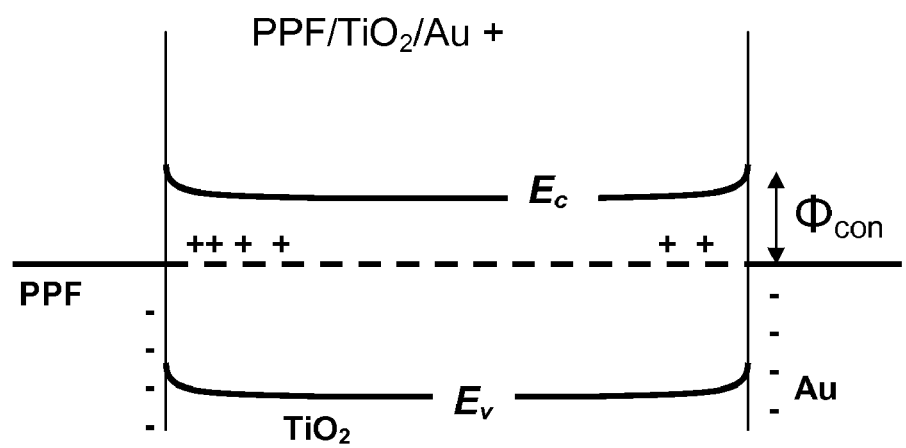
FIG. 12C provides the approximate energy level diagram at zero bias for a PPF/TiO$_2$/Au junction with traps in the TiO$_2$.
Figure 12D:
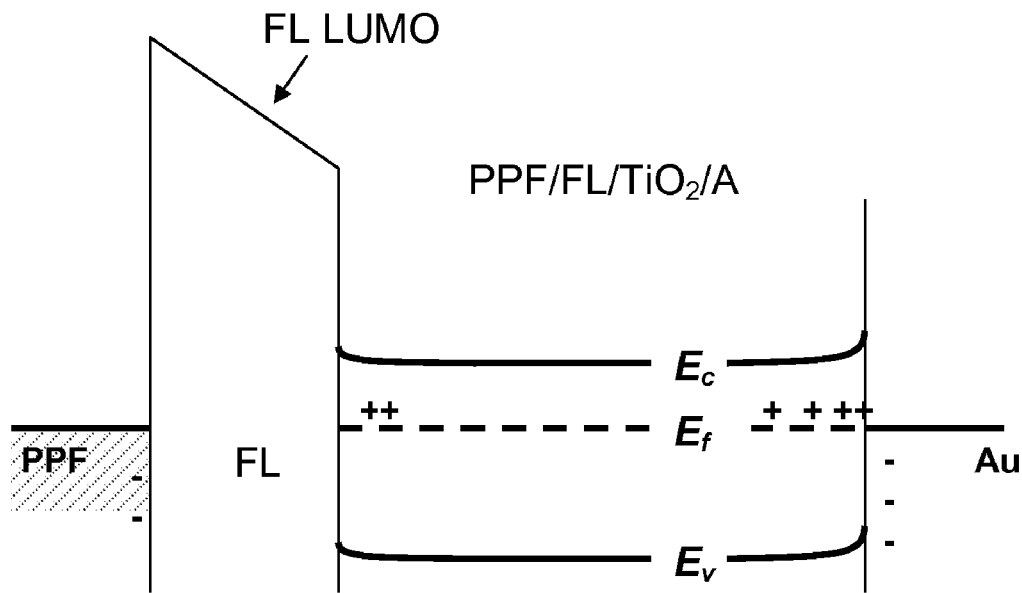
FIG. 12D provides the approximate energy level diagram at zero bias for a PPF/FL/TiO$_2$/Au junction.

Given the relatively complex structure of a PPF/FL/TiO$_2$/Au heterojunction, with at least three interfaces, a nanocrystalline TiO$_2$ layer, and a molecular monolayer to consider, there are many possible ET mechanisms which might determine the observed electronic behavior. As noted previously, Raman Spectroscopy provided direct evidence for activated structural plasticity in NAB/TiO$_2$ and NAB/Al$_2$O$_3$ junctions under the influence of an applied bias. In addition to structural changes, possible Schottky barriers, tunneling, traps, and redox activity could all contribute to the observed J/V response and ET mechanism(s). Several of these phenomena are illustrated in the energy level diagrams of FIG. 12, for the unbiased junctions. The levels are approximate, but are based on known values of the $TiO_2$ band gap (3.1 eV), the approximately equal work functions for Au and PPF (~5 eV), and the HOMO-LUMO gap for fluorene (~5 eV). When the isolated phases shown in FIG. 12A are combined in a junction, some charge transfer is expected from the $TiO_2$ to the PPF and Au, generating Schottky barriers at each interface in a PPF/$TiO_2$/Au junction (12B) and possibly band bending in the $TiO_2$. If traps are present in the $TiO_2$, they may depopulate and lower the contact barrier (FIG. 12C). Up to this point, the junction is electrically nearly symmetric, due to the similar work functions of PPF and Au. In a PPF/FL/$TiO_2$/Au junction, the tunneling barrier generated by the fluorene layer makes the junction asymmetric, and the extent of charge transfer at the two interfaces is likely different. The result is a built-in field across the fluorene layer.

While a comprehensive description of all ET mechanisms operative in the current junctions would require significantly more data than currently in hand, the results do permit conclusions about three regimes of the J/V response, which will be considered in turn. First, the low voltage region between −1 and +1 V exhibits low conductance at any temperature and scan rate studied. Second, a "fast" response over a few msec time scale occurs for voltage magnitudes exceeding ~1.5 V, and is weakly temperature dependent. Third, a slower and persistent change in conductance follows relatively long pulses (>1 msec) and is strongly temperature dependent. Throughout the discussion of these three regions, it is important to consider the effect of adding the fluorene layer to the PPF/$TiO_2$/Au junction, which introduces structural asymmetry into the junction structure.

The junction resistance at low voltage (±1 V) is high, in the range of $10^4$-$10^5$ Ω-$cm^2$, or 2-20 MΩ for the 0.005 $cm^2$ junction area. At 1000 V/sec, a capacitive component is observable, and the slope near zero bias indicates a dependence of resistance on temperature (FIG. 5C). The capacitance at 1000 V/sec and V=0 is approximately 0.9 μF/$cm^2$ for a PPF/FL/$TiO_2$/Au junction, yielding an average dielectric constant of 7.2 based on a parallel plate capacitor model with a thickness of 6.8 nm. A coherent tunneling mechanism based on the Simmons formula yields a predicted low voltage resistance of >$10^{12}$ Ω-$cm^2$ for a 6.8 nm thick junction and unreasonably low barrier height of 0.5 eV. Furthermore, coherent tunneling would be neither scan rate nor temperature dependent. Therefore, the low voltage J/V behavior for the V=±1 volt range cannot be explained by conventional tunneling, and other phenomena must be involved. Furthermore, a proposed mechanism must also account for the variation of both low voltage resistance and capacitance with scan rate and temperature.

The anomalous behavior of the capacitance apparent in FIG. 5C, and the transient response to voltage pulses (8C and 8D) are inconsistent with a conventional parallel plate capacitor. In previous reports, we noted frequency dispersion of the observed capacitance, with the capacitance decreasing for higher frequency or scan rate. It is apparent from table 1 that the "backstep charge" stored in the junction during the voltage pulse is not greatly affected by the presence of the fluorene or $Al_2O_3$ layers, and is independent of whether the junction exhibits DC conduction. These observations are consistent with a conductance mechanism operative in semiconductors and insulators, i.e. space charge limited conduction (SCLC)[55-60]. As the bias increases, electrons may be injected into the $TiO_2$ to form a space charge, with electrons located both in the $TiO_2$ interior and at the conductor/$TiO_2$ interfaces. In the simplest case of a perfect crystal, this space charge provides carriers in the conduction band, and the current density follows Child's law, equation (1):

$$J = \frac{9\mu \in V^2}{8d^3} \qquad (1)$$

Where $\mu$ is the mobility ($cm^2V^{-1}sec^{-1}$), $\varepsilon$ the permittivity (F $cm^{-2}$) and d is junction thickness (cm).

Figure 13A:
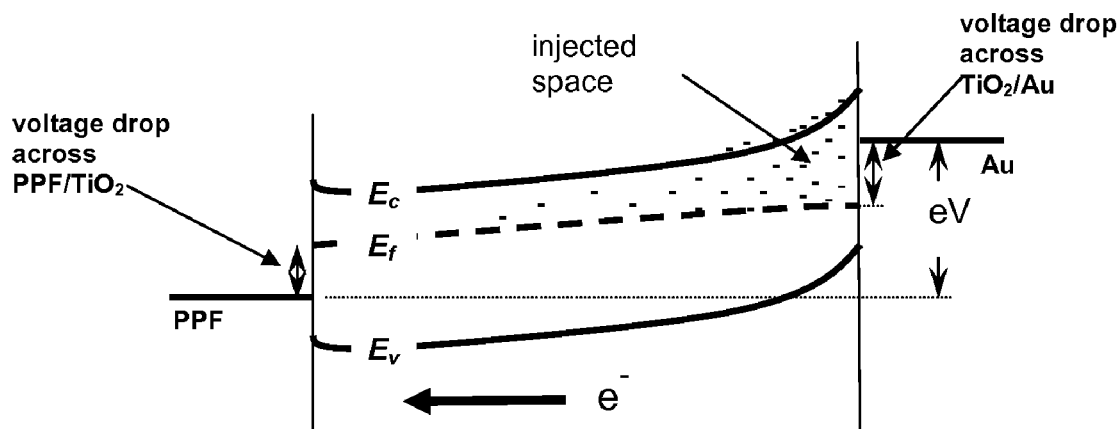
FIG. 13A provides an energy level diagram under applied bias for a PPF/TiO$_2$/Au junction with positive bias (PPF positive relative to Au).

Considering the case of PPF/$TiO_2$/Au initially, the flat J/V curve below |V|=1.5 V implies that few electrons are injected into the $TiO_2$, presumably because the potential is insufficient to overcome the contact barriers at the PPF/$TiO_2$ and Au/$TiO_2$ interfaces. FIG. 13A shows a modification of FIG. 12C for the case of an applied bias. As the bias magnitude is increased beyond 1.5 V, the contact barrier becomes small enough that electron injection builds up a space charge in the form of conduction band electrons, hence more mobile charge carriers are available, and the current increases. However, the increase in current with bias is much faster than predicted by the $V^2$ dependence of equation 1. For example, the slope of ln(J) vs. ln(V) for PPF/$TiO_2$/Au (FIG. 6B) is 11.4 at 25 C and 10.5 at −135° C., for the voltage range where J exceeds 7 mA/$cm^2$. For PPF/FL/$TiO_2$/Au, the slope is. ~26 at 25° C. and ~12 at −139° C. Since equation 1 predicts a slope of 2 for ln(J) vs ln(V), SCLC is not a sufficient explanation for the observed J/V behavior. In addition, SCLC alone should not exhibit the hysteresis which is clearly evident in the J/V curves at room temperature.

A modification of the basic SCLC mechanism includes "traps", i.e. localized energy states which capture an otherwise mobile electron and prevent it from participating in conduction. Nanocrystalline $TiO_2$ is known to contain numerous traps, presumably at grain boundaries and other defects. Lampert provides a detailed description of the effect of traps on SCLC and discusses a "trap-filled limit" which is the voltage where enough electrons have been captured to fill all of the energetically accessible traps. At this voltage, the current increases rapidly from ohmic behavior (ln J vs ln V slope=1) to Childs law behavior, and can result in the large values of d(lnJ)/d(lnV) apparent in FIG. 6B. Since traps generally involve some nuclear reorganization in response to capture of an electron, they have an activation energy as well as a depth, and exhibit kinetics and temperature dependence. Although several reports estimate the trap depth in nanocrystalline $TiO_2$ to be 0.5-0.8 eV below the conduction band edge, there is likely to be a fairly wide distribution of trap energies. When traps with finite kinetics are included in the model, we can account for the J/V hysteresis as well as the sharp increase in current at high bias. When the scan rate is fast (1000 V/s), the traps do not have time to fill, and few injected electrons are trapped. At slow scan rates (e.g. 10 V/s), the traps equilibrate with the local Fermi level, and the sharp current increase is observed as most of the energetically accessible traps become filled. At intermediate scan rates (~100 V/sec), the traps are filling on a time scale comparable to the scan rate, and hysteresis is observed as detrapping time causes the current to lag the voltage after the scan is reversed.

Figure 3B:
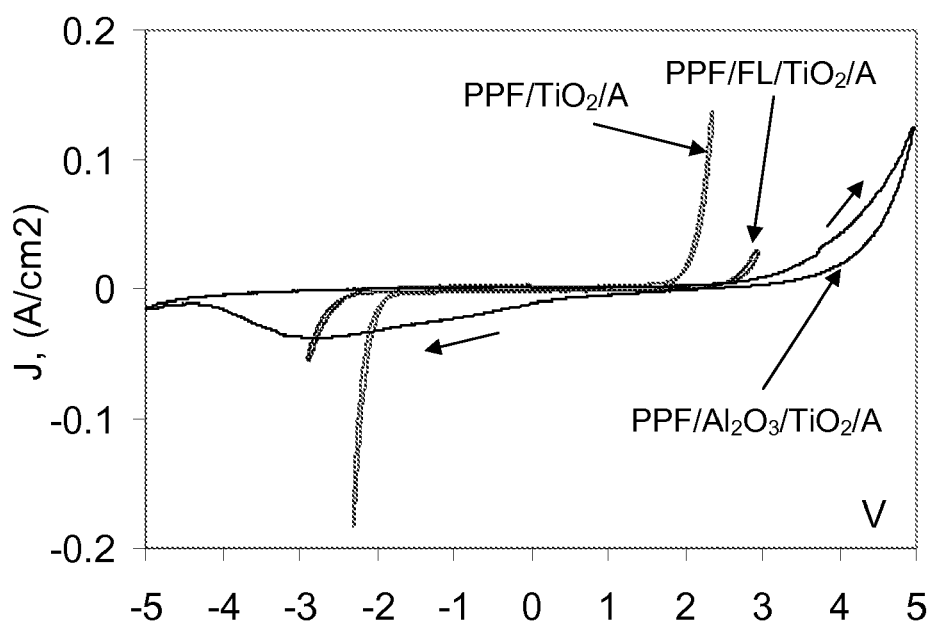
FIG. 3B compares the J/V curves for PPF/FL/TiO$_2$/Au, PPF/Al$_2$O$_3$/TiO$_2$/Au, and PPF/TiO$_2$/Au junctions at a scan rate of 1000 V/sec. Arrows indicate scan direction.
Figure 4A:
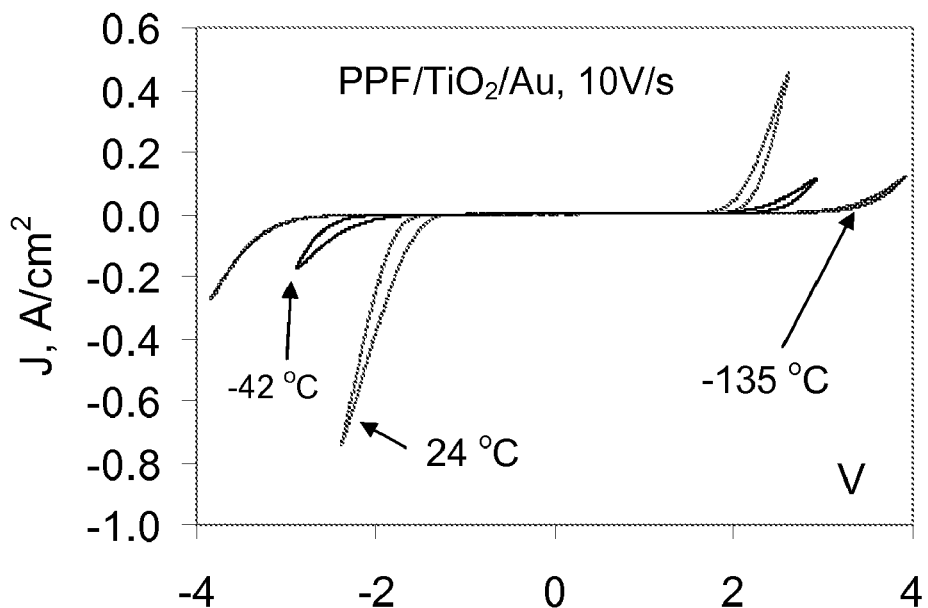
FIG. 4A illustrates the temperature dependence of the J/V curve for a PPF/TiO$_2$/Au junction at a scan rate of 10 V/sec.
Figure 4B:
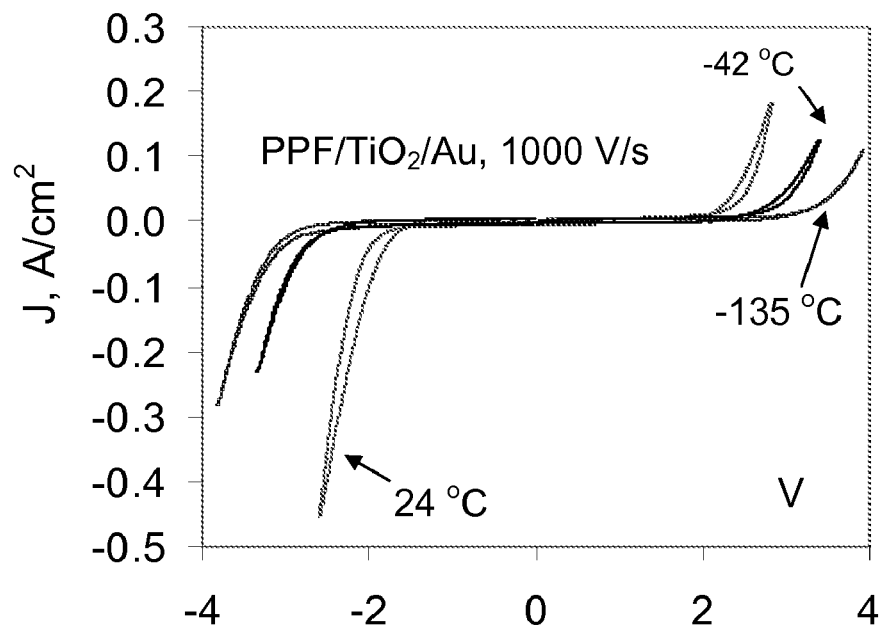
FIG. 4B illustrates the temperature dependence of the J/V curve for a PPF/TiO$_2$/Au junction at a scan rate of 1000 V/sec.
Figure 4C:
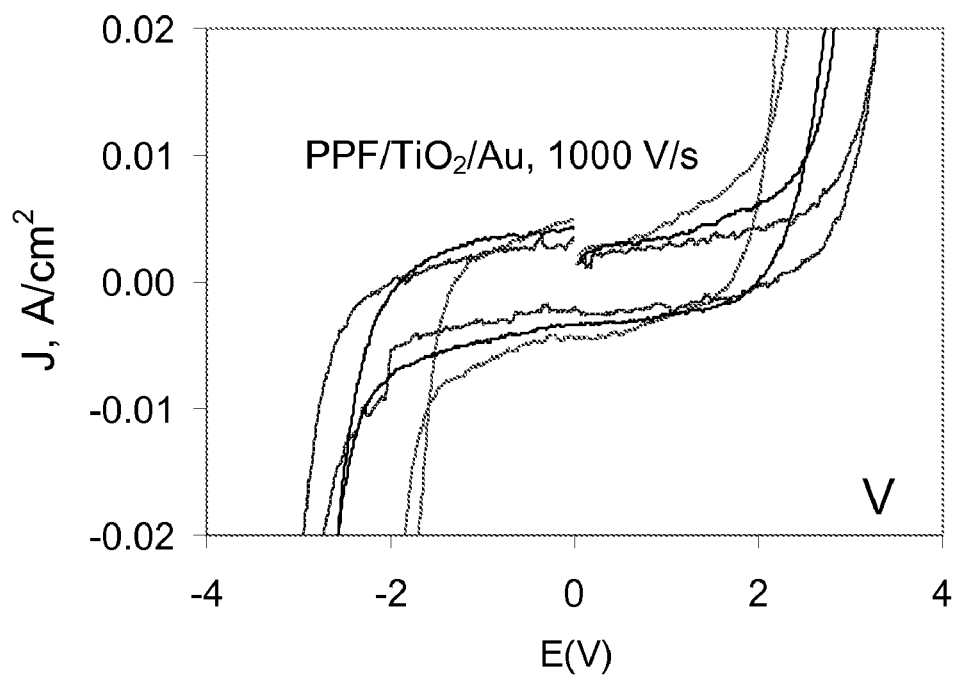
FIG. 4C is a close-up of a portion of FIG. 4B.
Figure 4D:
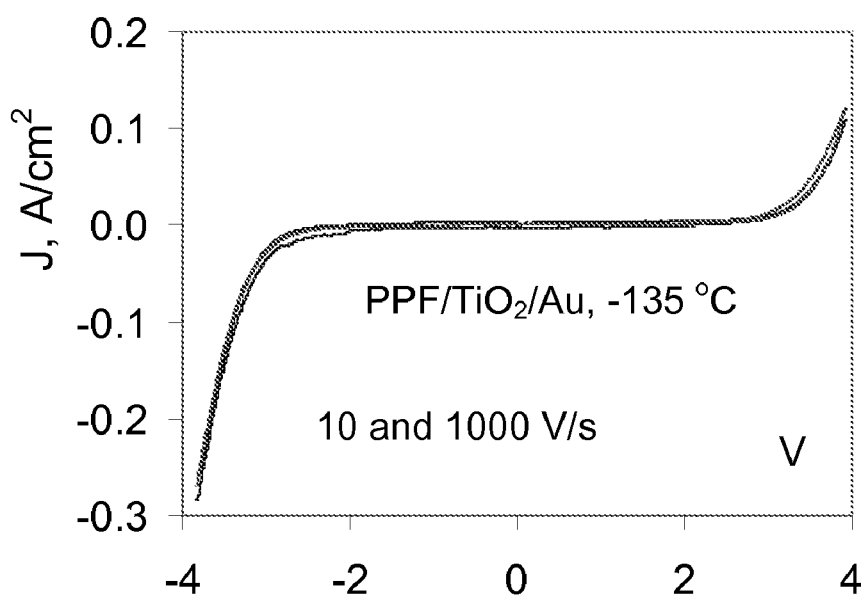
FIG. 4D compares the J/V curves for the PPF/TiO$_2$/Au junction at scan rates of 10 and 1000 V/sec at a temperature of −135° C.

Many traps in $TiO_2$ should be accessible in the absence of DC conduction, in junctions with fluorene or $Al_2O_3$ layers, or $TiO_2$ alone. As the Fermi level in the $TiO_2$ increases near the negatively biased electrode, traps will start to fill regardless of DC current flow. The behavior of PPF/$Al_2O_3$/$TiO_2$/Au junctions is informative in this case because the only current observed is that associated with parallel plate and space charge capacitance. We attribute the peak in the J/V curve of PPF/Al$_2$O$_3$/TiO$_2$/Au in FIG. 3B at V=−3 V to the "detrapping" of electrons injected during the positive scan, when Au was negative. Furthermore, we assert that the backstep charge tabulated in Table 1 and the unusual current decay apparent in FIGS. 8C and D arise mostly from trapped charge, not only because the rate of charge decay is too slow to be consistent with the RC time constant of the structure, but also because the time dependence of the current response can not be explained without the introduction of an energetic barrier to impede the normal resistive decay of the space charge.

A model based on SCLC with traps accounts for most of the experimental observations, including the sharp increase in current at the "trap filled limit", the hysteresis, and the trends observed in the backstep charge with changes in composition, time, and pulse voltage. However, the "slow" (1-100 msec) rise in current (FIG. 7A) and memory effect lasting several minutes (FIG. 10) are not consistent with a mechanism based solely on SCLC and traps. The voltammetry and pulse experiments indicate that charge injection and trapping occur in a few msec, and the space charge is dissipated in much less than 10 msec after the bias is returned to zero (FIG. 8). The "slow" rise in current is strongly temperature dependent, while the submillisecond transients are not. The DC conductance changes and memory effect are strongly dependent on junction composition (FIG. 7C), while the transient current and charge vary by only a factor of ~2 for FL/TiO$_2$, Al$_2$O$_3$/TiO$_2$, and TiO$_2$ only junctions. The pronounced differences in time scale and dependence on junction structure require an additional phenomenon to be considered, other than SCLC with traps.

Figure 7C:
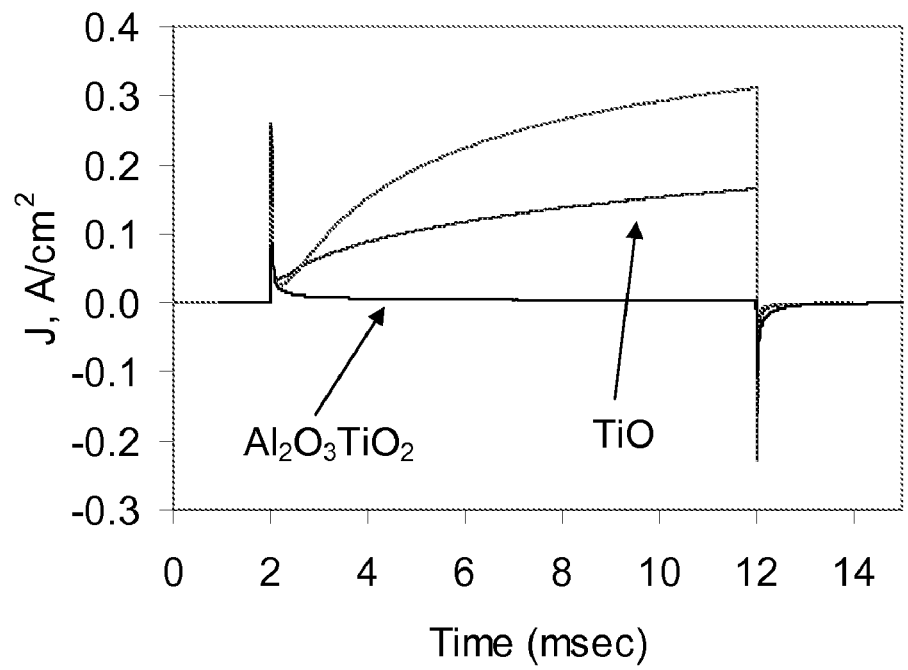
FIG. 7C is a comparison of 10 msec pulses to PPF/FL/TiO$_2$/Au, PPF/Al$_2$O$_3$/TiO$_2$/Au, and PPF/TiO$_2$/Au junctions. Pulse amplitude was +3V for the PPF/FL/TiO$_2$/Au and PPF/Al$_2$O$_3$/TiO$_2$/Au junctions and +2V for the PPF/TiO$_2$/Au junction.
Figure 13B:
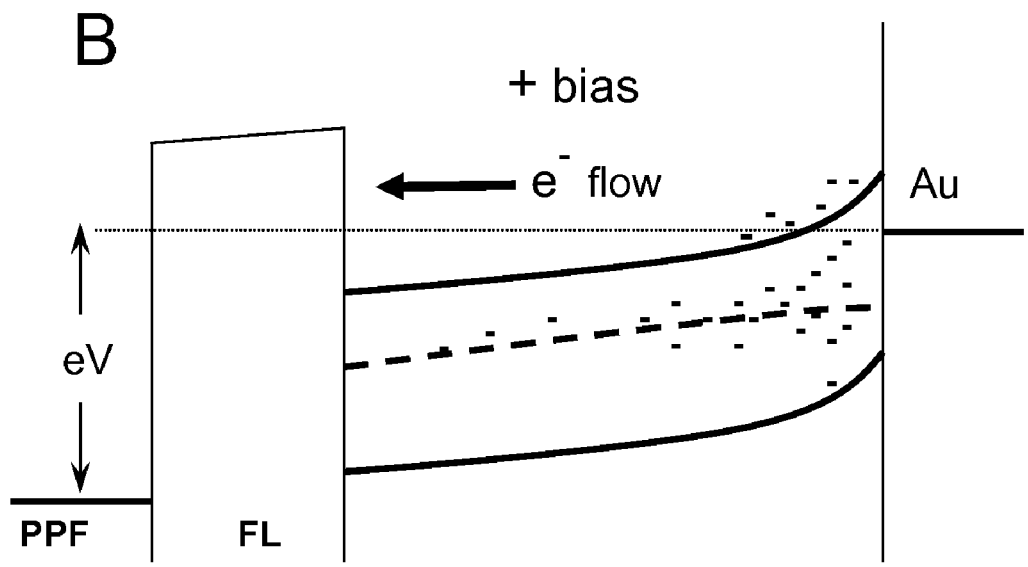
FIG. 13B provides an energy level diagram under applied bias for a PPF/FL/TiO$_2$/Au junction under positive bias.

Consider again the pulse responses of FIGS. 7A and 7C, and the memory effect shown in FIGS. 10 and 11. For the PPF/Al$_2$O$_3$/TiO$_2$/Au junction, only the transient current is observed, since DC current is blocked by the Al$_2$O$_3$, although the other junctions clearly exhibit a substantial level of DC conduction. For the PPF/TiO$_2$/Au junction, electron injection begins from either Au or PPF when the voltage is high enough to overcome the contact barriers shown in FIG. 13A, and the traps begin to fill. A steady state is reached in which electrons enter and exit the TiO$_2$ at the same rate, and the quasi Fermi level of the TiO$_2$ does not undergo a large net change. When the bias is returned to zero, the traps empty, and there is no persistent memory effect. The junction behaves as if it were electronically symmetric, implying that the barriers present at the PPF/TiO$_2$ and TiO$_2$/Au interfaces are similar, as expected from the approximately equal work functions of PPF and Au. Introduction of the fluorene layer to make a PPF/FL/TiO$_2$/Au junction makes the junction structurally asymmetric, but unlike Al$_2$O$_3$, the FL layer does not block DC conduction. During positive bias, the Au/TiO$_2$ interface is negative and electrons are injected into the TiO$_2$. The space charge builds up, with trapping until tunneling across the fluorene layers equals the rate of electron injection (FIG. 13B). The requirement for a relatively high field to tunnel through the fluorene layer has the effect of increasing the TiO$_2$ Fermi level. We propose that this high Fermi level causes a relatively slow reduction reaction in the TiO$_2$, to produce a Ti$^{III}$ or Ti$^{II}$ oxide. Alternatively, the rate of oxidation at the positive electrode in a PPF/TiO$_2$/Au junction may equal the rate of reduction at the negative electrode, and this balance may be disturbed by the addition of the FL layer. There are several possibilities for a reduction reaction, such as:

(2)

(3)

These reactions obviously involve structural rearrangements, and will have associated activation barriers and temperature dependence. After the bias is returned to V=0, any space charge will dissipate in a few msec, but the Ti$_2$O$_3$ will persist, although the reaction will eventually reverse at a rate controlled by its activation energy.

Figure 13C:
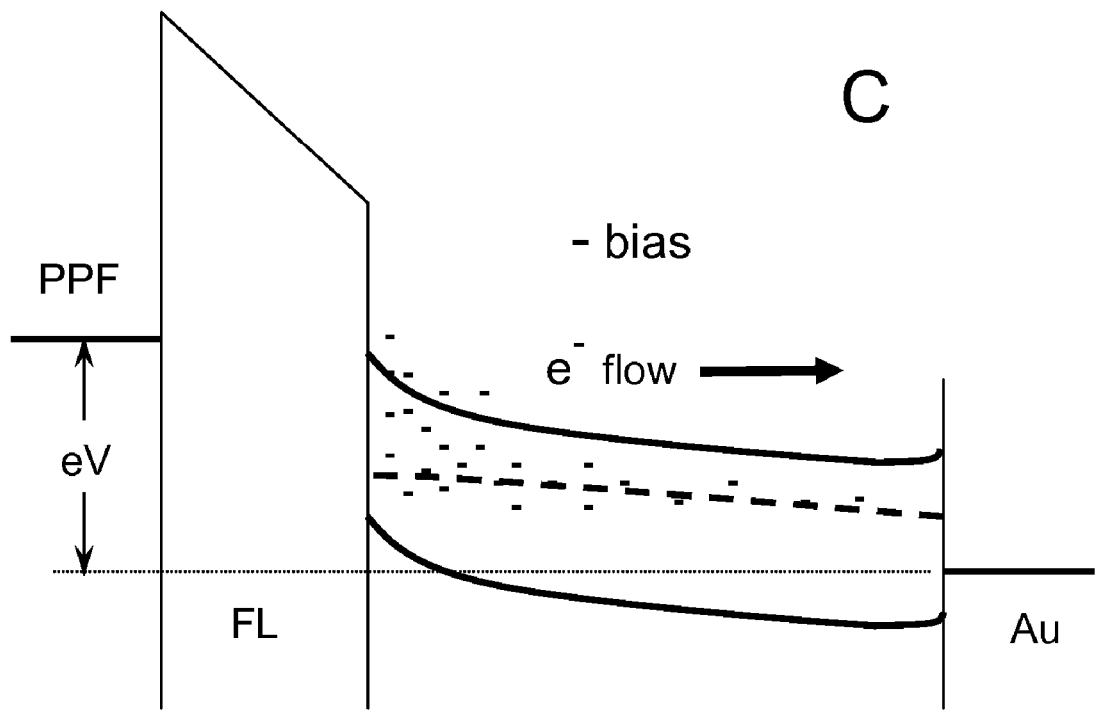
FIG. 13C provides an energy level diagram under applied bias for a PPF/FL/TiO$_2$/Au junction under negative bias.

The major consequence of Ti$_2$O$_3$ generation is its much higher conductivity compared to TiO$_2$, by ~10 orders of magnitude. The conduction band electrons associated with Ti$_2$O$_3$ are mobile, and the TiO$_2$ is effectively "doped" to become an n-type semiconductor. As is apparent from FIG. 2A, the fluorene layer can support high current densities in PPF/FL/Cu junctions, so an increase in conduction of the TiO$_2$ layer will lead to an overall increase in junction conductance. In the case of the PPF/TiO$_2$/Au junction, the reduction process is less pronounced, presumably because the TiO$_2$ layer cannot become sufficiently negative. Although ET through the TiO$_2$ is more efficient than through FL/TiO$_2$, the lack of the FL tunneling barrier diminishes the increase in the local Fermi level in the TiO$_2$, thus decreasing the driving force for TiO$_2$ reduction. With the FL absent, the memory effect is weak, implying that TiO$_2$ reduction is required for persistent conductance changes. Once the high conductance state is produced by TiO$_2$ reduction, it may be "erased" by a negative voltage pulse as shown in FIGS. 10A and 10C and schematically in FIG. 13C. During the erase pulse, the Au is positive, the quasi Fermi level in the TiO$_2$ decreases, and reaction 2 and 3 should reverse, thus reoxidizing Ti$_2$O$_3$. In effect, the reduction of TiO$_2$ by the accumulated space charge is a form of "dynamic doping", in which the conductance of the oxide is dramatically increased by a positive bias, through generation of Ti$_2$O$_3$. The fluorene layer permits the oxide to partially "float" relative to the PPF, so that the quasi Fermi level can track the Au potential.

It is well known that various types of "breakdown" can occur in insulators under an imposed electric field, and such effects have been reported for TiO$_2$ and metal/molecule junctions containing Ti. Loosely speaking, the redox mechanism described here is a type of breakdown, in that the initially insulating oxide is made conductive by injection of electrons, and the oxide structure is modified. However, the redox modulation of conductance is reversible for at least hundreds of cycles, and may be driven to a high and low state depending on bias polarity. Therefore, it differs fundamentally from conventional dielectric breakdown mediated by pinhole formation or local thermal transients. It is not yet known if the conductance paths formed by the redox process are localized, but the proposed mechanism is consistent with homogeneous generation of Ti$^{III}$ sites, with accompanying generation of conduction band electrons.

As discussed in previous reports, the role of ion motion and impurities in the TiO$_2$ and/or molecular layer is not clear. It is possible that a reduction reaction such as equation 2 or 3 could be "balanced" by an image charge in the PPF, effectively stabilizing the space charge with a high electric field. Alternatively, the injected electrons may originate in the molecular layer, as was demonstrated spectroscopically for PPF/NAB/TiO$_2$/Au junctions. Fluorene has a high redox potential for oxidation to a radical cation (~+2V), so its participation in redox reactions is less likely than NAB. Additional spectroscopic experiments are presently underway to determine the conditions required for TiO$_2$ reduction, by using UV-Vis absorption to monitor the TiO$_2$ redox state. Whether or not mobile ions are involved, it is reasonable to propose that reactions such as (2) or (3) above may be driven by a high electron density in the TiO$_2$ layer, in a manner similar to a conventional electrochemical reduction. The current work supports and elaborates previous conclusions that the principal effect of an applied bias on conductance is modulation of the $TiO_2$ electronic properties. The effects of charge balance, ion motion and image charges on junction electronic behavior is a topic of current investigation.

In view of the present disclosure or through practice of the present invention, it will be within the ability of one of ordinary skill to make modifications to the present invention, such as through the use of equivalent arrangements and compositions, in order to practice the invention without departing from the spirit of the invention as reflected in the appended claims.

What is claimed is:

1. A solid-state electronic junction, said electronic junction comprising:
    a first conductive component, said first conductive component comprising:
        a substrate having a contact surface; and
        at least one layer of molecular units, wherein at least one layer of molecular units is attached to said contact surface through a type of association selected from the group consisting of: covalent bonding and strong electronic coupling;
    a second conductive component comprising a layer of at least one first metal-containing compound and at least one second metal-containing compound adjacent to, and in electrical communication with, said at least one layer of said molecular units, said electronic junction having a conductance that reversibly changes in response to an applied voltage across said electronic junction; and
    a layer having a high reduction-oxidation potential for oxidation to a radical cation interposed between the first and second conductive components.

2. The electronic junction according to claim 1 wherein at least one said layer of molecular units comprises a chemical structure that reversibly changes from a relatively non-conductive state to a relatively conductive state by the application of an electrical stimulus.

3. The electronic junction according to claim 1 wherein said layer of at least one first metal-containing compound and at least one second metal-containing compound reversibly changes from a relatively non-conductive state to a relatively conductive state by the application of an electrical stimulus.

4. The electronic junction according to claim 1 wherein said second conductive component is capable of storing a charge.

5. The electronic junction according to claim 1 wherein said first conductive component is capable of storing a charge.

6. The electronic junction according to claim 1 wherein said molecular units comprise a chemical structure having at least one aromatic group when in a relatively non-conductive state.

7. The electronic junction according to claim 1 wherein said molecular units comprise a chemical structure that is selected from the group consisting of: substituted phenyl groups, unsubstituted phenyl groups, substituted benzyl groups, unsubstituted benzyl groups, substituted phenolic groups, unsubstituted phenolic groups, substituted metalloporphyrin rings, unsubstituted metalloporphyrin rings, substituted ferrocene groups and unsubstituted ferrocene groups.

8. The electronic junction according to claim 1 wherein said molecular units comprise a chemical structure that is selected from the group consisting of: biphenyl groups, fluorene groups, anthracene groups, phenanthrene groups, polyphenylene groups, polynuclear aromatic hydrocarbon groups, nitrated biphenyl groups, azobenzyl groups, and nitroazobenzyl groups.

9. The electronic junction according to claim 1 wherein said molecular units are chemically bonded to said contact surface of said substrate by a chemical bond having the formula:

$$R-X$$

wherein R is a metal, silicon or carbon atom of said substrate and X is an oxygen or carbon atom of said molecular unit.

10. The electronic junction according to claim 1 wherein said substrate of said first conductive component comprises a material selected from the group consisting of: electrically conductive carbon, metals, metal alloys, and metal nitrides.

11. The electronic junction according to claim 1 wherein molecular units of said at least one layer of molecular units are substantially the same length.

12. The electronic junction according to claim 1 wherein said second conductive component is chemically bound to said second ends of at least one layer of molecular units.

13. The electronic junction according to claim 1 wherein said molecular units in at least one layer are substantially parallel to one another.

14. The electronic junction according to claim 1 wherein at least some of said molecular units form an arrangement of molecular orbitals such that said electronic junction is capable of functioning as a semiconductor.

15. The electronic junction according to claim 1 wherein said first metal-containing compound is a metal.

16. The electronic junction according to claim 1 wherein said first metal compound is a metal nitride.

17. The electronic junction according to claim 1 wherein said first metal-containing compound is selected from the group consisting of: titanium, silver, gold, tungsten, chromium, copper, titanium nitride, silver nitride, gold nitride, tungsten nitride, chromium nitride, copper nitride, tantalum nitride, and tungsten/titanium alloy.

18. The electronic junction according to claim 1 wherein said second metal-containing compound is a covalently-bonded metal compound.

19. The electronic junction according to claim 18 wherein said covalently-bonded metal compound is selected from the group consisting of: titanium oxides, silver oxides, gold oxides, tungsten oxide, chromium oxides, copper oxides, and tantalum oxides.

20. The electronic junction according to claim 18 wherein said covalently bonded metal compound is selected from the group consisting of: metal oxides, metal nitrides, metal sulfides, and metal halides.

21. The electronic junction according to claim 18 wherein said covalently-bonded metal compound is selected from the group consisting of: titanium nitrides, titanium sulfides, titanium halides, silver nitrides, silver sulfides, silver halides, gold nitrides, gold sulfides, gold halides, tungsten nitrides, tungsten sulfides, tungsten halides, chromium sulfides, chromium halides, chromium nitrides, copper nitrides, copper sulfides, copper halides, and tantalum nitrides.

22. The electronic junction according to claim 1 wherein said second metal-containing compound is an ionically-bonded metal compound.

23. The electronic junction according to claim 22 wherein said ionically-bonded metal compound is selected from the group consisting of: silver chloride, copper (I) chloride, copper (II) chloride, and sodium chloride.

24. The electronic junction according to claim 1 wherein said second conductive component additionally comprises at least one ion.

25. A memory device for storing data, said memory device comprising at least one electronic junction according to claim 1.

26. A solid state electronic junction, said electronic junction comprising:
a first conductive component, said first conductive component comprising:
a substrate having a contact surface; and
at least one layer of molecular units attached to said contact surface, the at least one layer of molecular units allowing DC conduction;
a second conductive component comprising a layer of at least one first metal-containing compound and at least one second metal-containing compound adjacent to, and in electrical communication with, said at least one layer of said molecular units, said at least one second metal-containing compound having a first structural configuration having a first conductance, said at least one second metal-containing compound having a second structural configuration having a second conductance when a set pulse is applied, said at least one second metal-containing compound returning to said first structural configuration having a first conductance upon application of an erase pulse.

27. The electronic junction according to claim 26 wherein at least one said layer of molecular units comprises a chemical structure that reversibly changes from a relatively non-conductive state to a relatively conductive state by the application of an electrical stimulus.

28. The electronic junction according to claim 26 wherein said layer of at least one first metal-containing compound and at least one second metal-containing compound reversibly changes from a relatively non-conductive state to a relatively conductive state by the application of an electrical stimulus.

29. The electronic junction according to claim 26 wherein said second conductive component is capable of storing a charge.

30. The electronic junction according to claim 26 wherein said first conductive component is capable of storing a charge.

31. The electronic junction according to claim 26 wherein said molecular units comprise a chemical structure having at least one aromatic group when in a relatively non-conductive state.

32. The electronic junction according to claim 26 wherein said molecular units comprise a chemical structure that is selected from the group consisting of: substituted phenyl groups, unsubstituted phenyl groups, substituted benzyl groups, unsubstituted benzyl groups, substituted phenolic groups, unsubstituted phenolic groups, substituted metalloporphyrin rings, unsubstituted metalloporphyrin rings, substituted ferrocene groups and unsubstituted ferrocene groups.

33. The electronic junction according to claim 26 wherein said molecular units comprise a chemical structure that is selected from the group consisting of: biphenyl groups, fluorene groups, anthracene groups, phenanthrene groups, polyphenylene groups, polynuclear aromatic hydrocarbon groups, nitrated biphenyl groups, azobenzyl groups, and nitroazobenzyl groups.

34. The electronic junction according to claim 26 wherein said molecular units are chemically bonded to said contact surface of said substrate by a chemical bond having the formula:

R—X wherein R is a metal, silicon or carbon atom of said substrate and X is an oxygen or carbon atom of said molecular unit.

35. The electronic junction according to claim 26 wherein said substrate of said first conductive component comprises a material selected from the group consisting of: electrically conductive carbon, metals, metal alloys, and metal nitrides.

36. The electronic junction according to claim 26 wherein molecular units of said at least one layer of molecular units are substantially the same length.

37. The electronic junction according to claim 26 wherein said second conductive component is chemically bound to said second ends of at least one layer of molecular units.

38. The electronic junction according to claim 26 wherein said molecular units in at least one layer are substantially parallel to one another.

39. The electronic junction according to claim 26 wherein at least some of said molecular units form an arrangement of molecular orbitals such that said electronic junction is capable of functioning as a semiconductor.

40. The electronic junction according to claim 26 wherein said first metal-containing compound is a metal.

41. The electronic junction according to claim 26 wherein said first metal compound is a metal nitride.

42. The electronic junction according to claim 26 wherein said first metal-containing compound is selected from the group consisting of: titanium, silver, gold, tungsten, chromium, copper, titanium nitride, silver nitride, gold nitride, tungsten nitride, chromium nitride, copper nitride, tantalum nitride, and tungsten/titanium alloy.

43. The electronic junction according to claim 26 wherein said second metal-containing compound is a covalently-bonded metal compound.

44. The electronic junction according to claim 43 wherein said covalently-bonded metal compound is selected from the group consisting of: titanium oxides, silver oxides, gold oxides, tungsten oxide, chromium oxides, copper oxides, and tantalum oxides.

45. The electronic junction according to claim 43 wherein said covalently bonded metal compound is selected from the group consisting of: metal oxides, metal nitrides, metal sulfides, and metal halides.

46. The electronic junction according to claim 43 wherein said covalently-bonded metal compound is selected from the group consisting of: titanium nitrides, titanium sulfides, titanium halides, silver nitrides, silver sulfides, silver halides, gold nitrides, gold sulfides, gold halides, tungsten nitrides, tungsten sulfides, tungsten halides, chromium sulfides, chromium halides, chromium nitrides, copper nitrides, copper sulfides, copper halides, and tantalum nitrides.

47. The electronic junction according to claim 26 wherein said second metal-containing compound is an ionically-bonded metal compound.

48. The electronic junction according to claim 47 wherein said ionically-bonded metal compound is selected from the group consisting of: silver chloride, copper (I) chloride, copper (II) chloride, and sodium chloride.

49. The electronic junction according to claim 26 wherein said second conductive component additionally comprises at least one ion.

50. A memory device for storing data, said memory device comprising at least one electronic junction according to claim 26.